(12) United States Patent
Mueller

(10) Patent No.: US 6,879,852 B1
(45) Date of Patent: Apr. 12, 2005

(54) LOW-COST MAGNETIC RESONANCE IMAGING (MRI) CRYO-SYSTEM

(76) Inventor: Otward M. Mueller, 96 Sweet Rd., Ballston Lake, NY (US) 12019-1804

( * ) Notice: Subject to any disclaimer, the term of this patent is extended or adjusted under 35 U.S.C. 154(b) by 602 days.

(21) Appl. No.: 09/613,075

(22) Filed: Jul. 10, 2000

(51) Int. Cl.$^7$ .............................................. A61B 5/05
(52) U.S. Cl. ........................ 600/410; 600/407; 600/411; 600/425
(58) Field of Search .................................. 600/411, 407, 600/410, 425; 324/318, 319, 320; 335/216, 296, 297, 300

(56) References Cited

U.S. PATENT DOCUMENTS

| | | |
|---|---|---|
| 5,010,304 A | 4/1991 | Mueller |
| 5,101,638 A * | 4/1992 | White ........................ 62/51.1 |
| 5,278,502 A | 1/1994 | Laskaris et al. |
| 5,406,204 A * | 4/1995 | Morich et al. .............. 324/318 |
| 5,539,367 A * | 7/1996 | Xu et al. ..................... 335/301 |
| 5,551,243 A * | 9/1996 | Palkovich et al. ........... 62/51.1 |
| 5,625,548 A | 4/1997 | Gold |
| 5,726,873 A | 3/1998 | Mueller |
| 5,734,565 A | 3/1998 | Mueller |
| 6,128,522 A * | 10/2000 | Acker et al. ................ 600/411 |
| 6,374,132 B1 * | 4/2002 | Acker et al. ................ 600/411 |

OTHER PUBLICATIONS

O. Mueller, W.A. Edelstein, and P.B. Roemer, "The cryogenic NMR gradient amplifier," *Eighth Annual Meeting, Society of Magnetic Resonance in Medicine*, Book of Abstracts, Part 2, p. 970, Amsterdam, The Netherlands, Aug. 12–18, 1989.

O. Mueller and W.A. Edelstein, "The cryogenic NMR RF power amplifier," *Society of Magnetic Resonance in Medicine (SMRM)*, 9th Annual Meeting, New York, NY, Book of Abstract, p. 205, Aug. 18–24, 1990.

* cited by examiner

Primary Examiner—Brian L. Casler
Assistant Examiner—William C. Jung
(74) Attorney, Agent, or Firm—Leonard Cooper

(57) ABSTRACT

Sub-systems and components of a MRI system have enhanced electrical efficiency, faster operation, reduced physical metrics, by operating at cryogenic temperatures and/or incorporating superconducting elements. A plurality of sub-systems and a super-conducting magnet are enclosed in a common Temperature-controlled chamber. Resistive or permanent magnets may be used in place of the superconductive magnet.

17 Claims, 18 Drawing Sheets

MRI System Using Cryogenic Power Conversion

Figure 3:
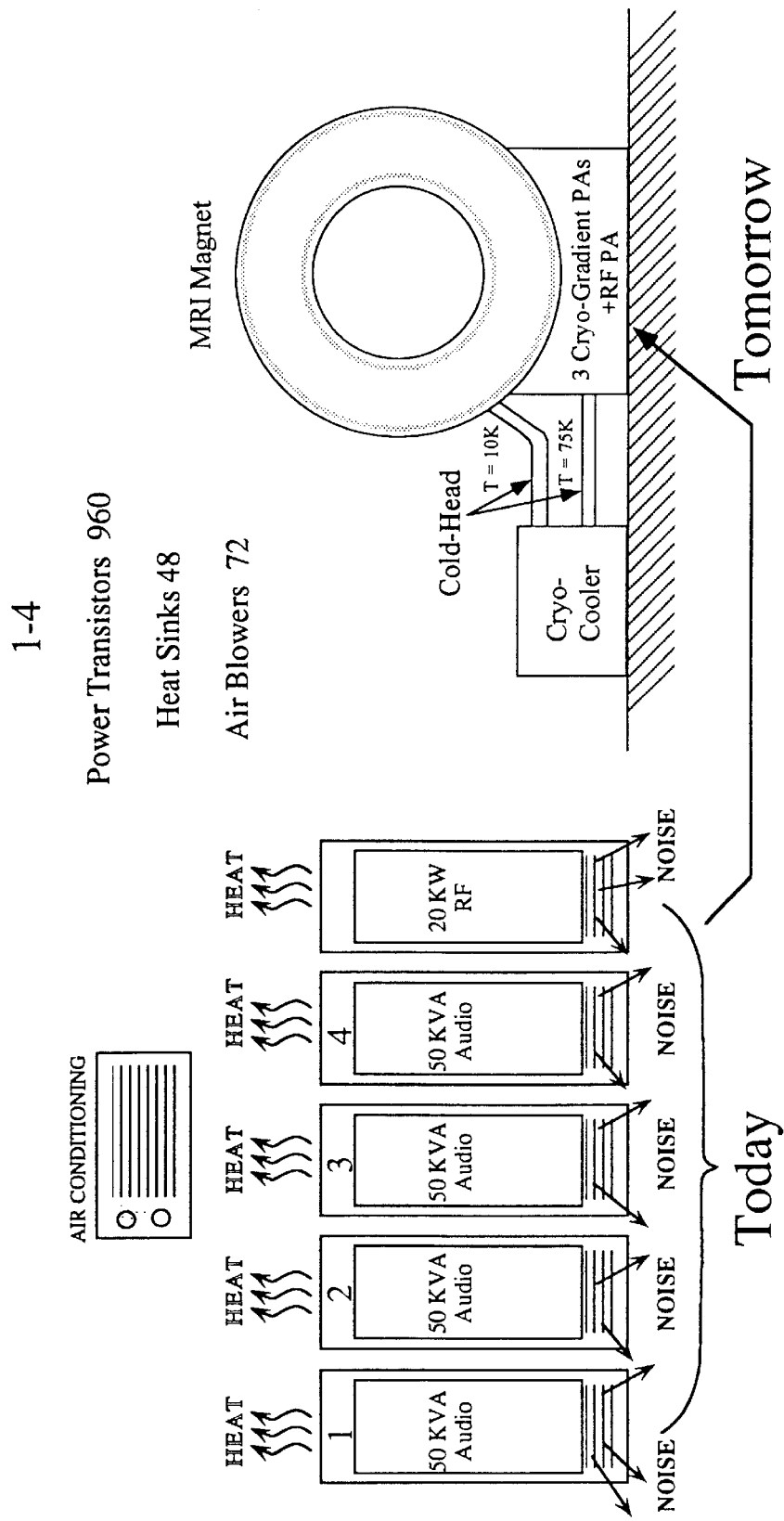

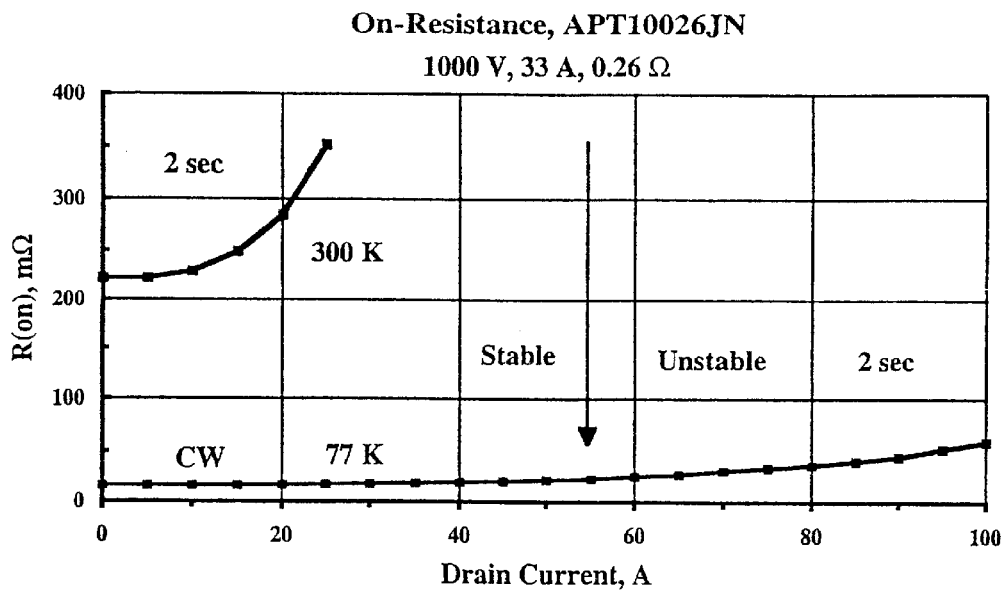
Figure 1: On-Resistance as a Function of Drain Current for the MOSFET APT10026JN at 300 K and 77 K
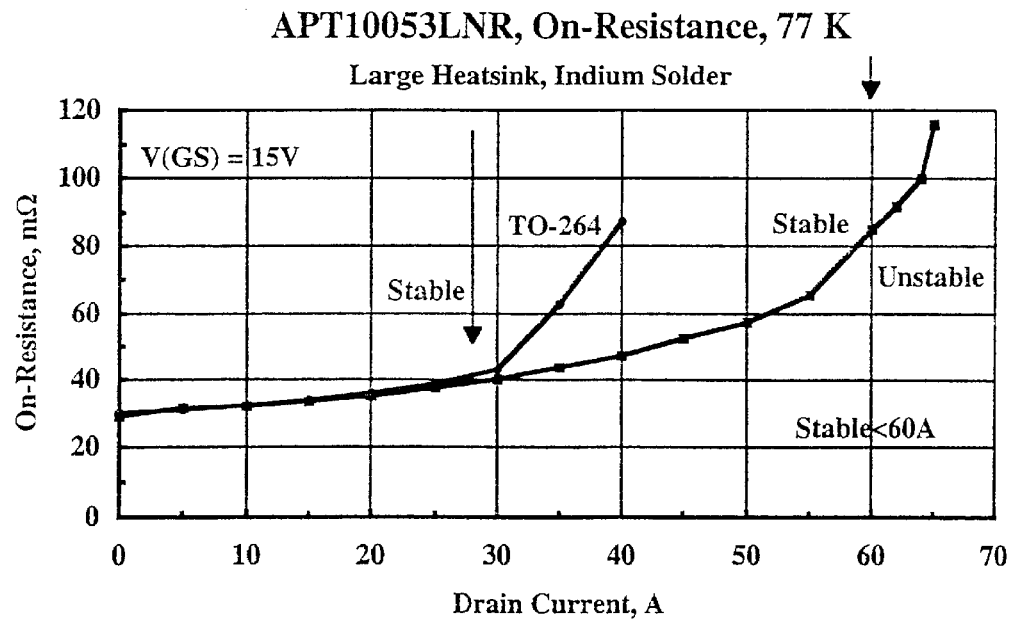
Figure 2: On-Resistance as a Function of Drain Current for MOSFET APT10053LNR (1000 V, 20 A, 0.53 Ω) at 77 K, with & without Heatsink Low-Cost MRI System Using Cryogenic Power Conversion Topology for Resonant Switchmode Gradient Amplifier The Stanley - Topology (S - Topology)
Full - Bridge Circuit Using 2 Opposed Current (OC) Half - Bridges FB-1 (Full-Bridge) Waveforms Cryogenic, High-Efficiency NMR RF Power Amplifier
Using MOSFET Drain Modulation Topology of Cryogenic MOSFET 1000V Gradient Amplifier/Speed-Up Inverter for HSI MRI Power System Using Cryogenic MOSFETs MRI System Using Cryogenic Power Conversion MRI System Using Cryogenic Power Conversion:
Cryogenic Receive Coil/Preamplifier Power MOSFET Assembly: Cross-Section A Power MOSFET Assembly: Cross-Section 1

4-Phase, 90° Shifted Inverter Topology for Ripple Reduction

LOW-COST MAGNETIC RESONANCE IMAGING (MRI) CRYO-SYSTEM

This application claims the benefit of provisional application No. 60/143,996.

1. IDENTIFICATION AND SIGNIFICANCE OF THE INVENTION

The new concept of Cryogenic Energy/Power Conversion (CEC, CPC) [M1–M18] can bring about drastic and highly desirable reductions in the size, weight, and cost of power electronics (Cryo-Micro-Power, CMP) at improved conversion efficiency by eliminating large, heavy heat sinks. This invention discloses that one of the most suitable application of CPC is that of a whole-body magnetic resonance imaging system. The rationale of such a Cryo-MRI system is explained in detail in the paper entitled "Cryogenic Power Inverters for Magnetic Resonance Imaging (MRI) Systems" which was presented at the CEC-ICMC 1999 Conference in Montreal by O. Mueller and E. K. Mueller (Jul. 12–16, 1999). The envisioned Cryo-MRI system will enable drastic size, weight and cost reduction and therefore contribute to cost reduction in the public health care system. It will also make available the benefits of MRI diagnostics to developing countries which are unable to pay the $1–2 million price tag for a conventional MRI system or the $500–$1200 for an MRI-scan.

2. BACKGROUND OF THE INVENTION

Magnetic resonance imaging (MRI) systems have revolutionized the field of medical diagnostics since 1982. A seldom considered key feature of these systems is that they also represent the first large-scale, commercial, profitable and successful application of low-temperature superconductivity (LTS) used in their high-field (0.3–5 Tesla) magnets. More then 12,000 whole-body MRI systems have been installed in hospiitals worldwide, providing a power base for Cryogenics which has not yet been exploited. Their price tag is still very high: $1–2 million. Therefore, most people do not yet have access to the benefits of this superb new diagnostic tool. An MRI scan still costs between $500 and $1200. Drastic cost reduction of such MRI systems is therefore desirable.

A new dimension has been added to this scenario by the invention and discovery of High-Temperature Superconductivity (HTS) by Bednorz and Miller (IBM Züirich) in 1986. This opens up new possibilities for the electronics of an MRI system in particular and for other systems in general. The key (potentially cryogenic) components of an MRI machine (excluding the digital computer) are (in the sequence of costs):

- The superconducting whole-body magnet (0.3, 0.5, 0.75, 1.0, 1.5, 3, 4 Tesla).
- Three gradient power amplifiers for the generation of the gradient magnetic fields enabling the spatial resolution of an MRI picture in the x, y, and z axes. The pulse power levels per axis are in the order of magnitude of 300 V, 100–200 A, 30–60 kVA.
- The RF pulse power amplifier (1–20 kW, 13, 21, 42, 64, 126, 168 MHz).
- RF receive coils using high-temperature superconductors plus cryo-preamplifiers.
- Add-on: Cryo-cooled laser diodes for laser surgery [2] and hyperpolarized inert gas MR imaging (patent pending).
- Equipment for cryo-surgery.

Figure 4:
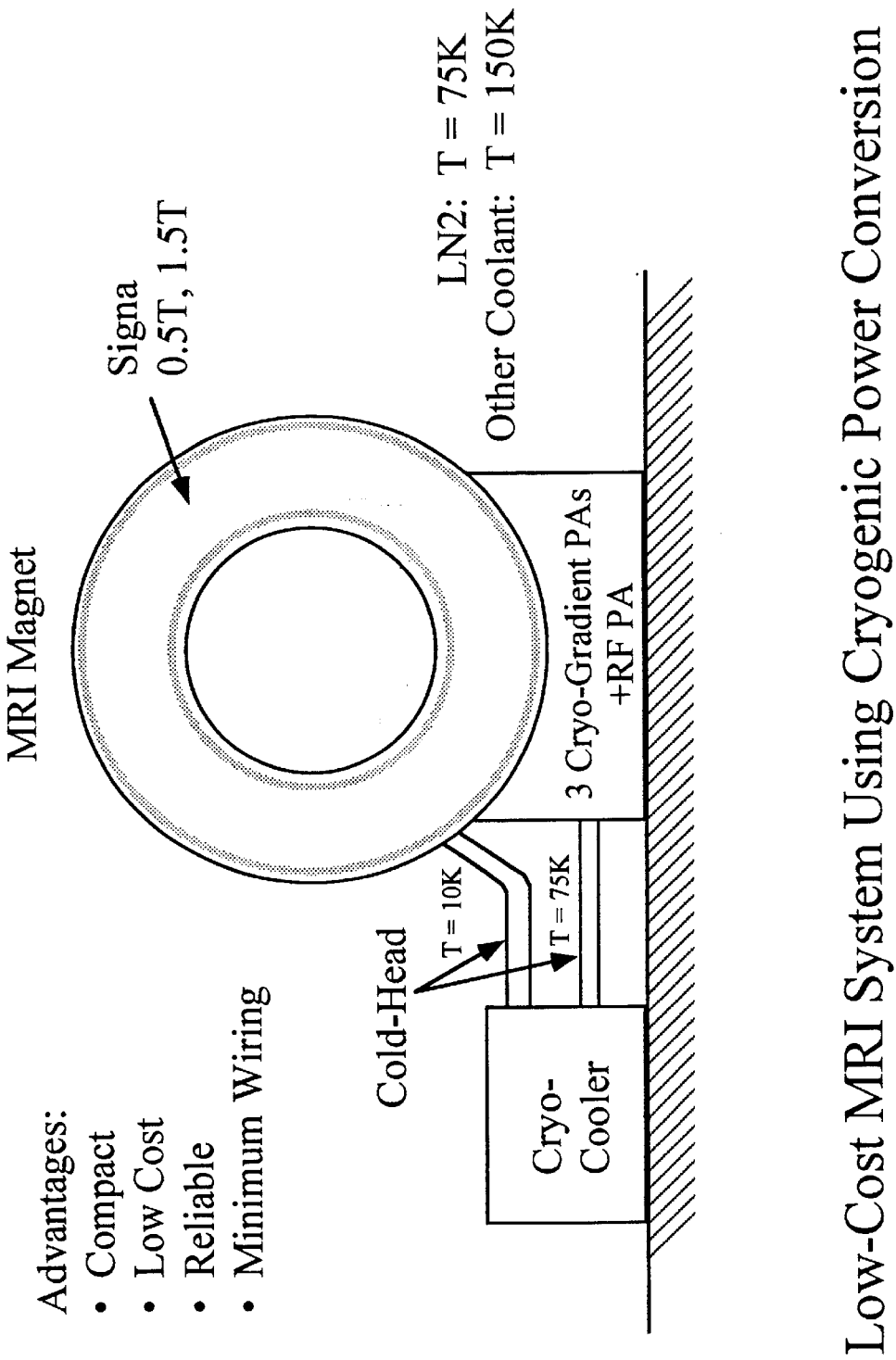

There is room and opportunity for the implementation of size and cost reduction in all of these components by the application of a new concept: Cryogenic Power Conversion (CPC) [M1–M20]. This concept is based on the MOSFET device properties shown in FIGS. 1 and 2: The drastic reduction in the loss producing on-resistance by cryo-cooling down to 77 K, the temperature of liquid nitrogen. Thus, one can envision a complete Cryo-MRI system which would be much smaller than the existing ones because all the components could be integrated into the main magnet assembly. This vision is illustrated by FIGS. 3 and 4.

A start has been made with researching the feasibility of a CPC implementation of the three MRI gradient amplifiers, which require high-speed PWM switching. Commercial applications include cost- and size-reduced Magnetic Resonance Imaging systems (MRI) providing improved performance for low-cost health care, MRI mass screening, etc. especially in rural areas and for export. Miniaturized, small size, high-efficiency cryogenic power conversion will also find applications in airplanes, ships, buses, trains, etc., especially in combination with high-temperature superconducting components.

In summary, it is believed that Magnetic Resonance Imaging (MRI) machines using superconducting magnets are well suited for a first implementation and demonstration of this CPC concept since cryogenics is already available, the required power levels are high, the duty cycles are low and various other system components such as the RF amplifiers [M9], HTS-RF receive coils, circuits using laser diodes for laser surgery [2], hyperpolarized inert gas MR imaging, and cryo-surgery equipment) can also be miniaturized by cryo-cooling. It is also assumed that the switching losses in a high-frequency (200–1000 kHz) switch-mode circuit can basically be eliminated or drastically minimized by soft-switching techniques.

3. A look at the history of the past half century clearly shows that there is no better size, weight and, therefore, cost reduction technology available than that provided by the Semiconductor Revolution. For example, a computer with the calculating power available in today's lap-top computer required the space of an entire office room thirty years ago. Unfortunately, power electronics has not yet benefited to the full possible extent from the potential provided by this silicon integrated circuit technology as have the fields of computers and communications. The reason is that the power density in power semiconductor devices is still too high. The key problem in the field of power electronics is to remove the high dissipation power generated by the semiconductor switching devices. A better solution is to reduce and minimize that dissipation at the source. This can be done by cryogenically cooling certain suitable power semiconductor devices such as MOSFETs: Cryo-MOSFET!

Cryogenic Power Conversion (CPC) using Cryo-MOSFETs requires, of course, the removal of some heat, which is not free. There are two approaches to this problem. The first is to provide a cryo-cooler for each circuit or system to be cooled. This is analogous to having a separate electrical generator for every house, a scheme which was found to be uneconomical a century ago when large generator stations in the multi-gigawatt range where built. Insistence on the one cryo-cooler per CPC circuit approach will kill the CPC concept. The second approach is to search for, to develop and to implement systems where a centralized cooling agent such as LN2 is employed in order to provide the cooling for several CPC circuits. Cyro-coolers are still relatively expensive due to the non-existent mass market at the present time.

A system which requires the cooling of several high-power components is now the proposed Cryo-MRI machine, the object of this invention. It requires the cooling of, first, the superconducting magnet, second, third and fourth the 3 gradient amplifiers (30–60 kVA each) for the 3 axes x, y, z in the 3-dimensional space [6], and fifth, the RF pulse power amplifier (1–10 kW pulsed) [21, 23]. In addition, one can add more cryo-cooled components such as the gradient coils themselves [22], RF receive coils using thin-film HTS inductors [13, 24] and the equipment required for Cryo-Surgery and/or Laser-Surgery in the future. A conventional gas laser transmitter for laser surgery could cost as much as $ 20k–50k while a cryo-laser diode may be much cheaper. The light output of semiconductor light-emitting diodes (LED) and lasers also increases by an order of magnitude or more through cryo-cooling. GaAs laser diodes for surgery as replacement for expensive gas lasers are under development [2]. In summary, one can envision 5–9 components of an MRI system which could benefit from cryo-cooling. Then a centralized cooling system becomes economical. In the case of superconducting (HTS) gradient coils [22] one would have very low losses and the high reactive gradient energy can be recovered at each pulse cycle.

In addition, cryo-computers exhibiting high clock frequencies can be added to the set of cryo-cooled components.

An assumption for this project is that the MOSFET switching losses can be drastically reduced by suitable "soft-switching" techniques and the conduction losses by cryo-cooling. (R. DeDoncker: "The switching losses can be virtually eliminated" [9].)

In order to understand the CPC concept [7, 10, 12, 16] one has to study the properties of the Cryo-MOSFET and other required components.

4. The Cryo-MOSFET and the IGBT

High-efficiency power conversion circuits require fast, low-loss switches. From the series of available switches (GTOs, MCTs, SCRs, MTOs, IGBTs, Bipolar transistors, BITs) the MOSFET is the fastest. This is one of its great advantages.

It has been found [7] that commercially available, non-FREDFET [16], power MOSFETs in low-cost plastic packages (TO-247, TO-264 etc.) work well when immersed in liquid nitrogen at a temperature of 77 K, even if they were in no way designed for such a "cool" operation. FIG. 1 shows the measured on-resistance of a typical device as a function of the drain current at 300 K and 77 K: APT10026JN (APT-MOS technology, ratings: 1000 V, 33 A, 0.26 Ω). The on-resistance improvement factor is about F=15 at low drain currents. It would be higher (350–400 K) for a DC measurement and in actual operation with internal junction heating at 300 K. One can see the drastic reduction of the loss-producing on-resistance by cryo-cooling in addition to a remarkable increase in the current handling capability up to 100 A–125 A. The on-resistance can now be made as small as desirable by paralleling more MOSFETs, a feature not possible with minority carrier devices such as IGBTs, MCTs, GTOs, SCRs, etc. which exhibit an on-state threshold voltage of 1–2 V. ("Silicon is cheap!").

The new COOL-MOS devices from Siemens and IRC have even lower on-resistance both at 300 K and 77 K [26]. In a 500 V device the improvement factor comparing conventional MOSFET at 300 K with a COOL-MOS at 77 K is about F=25.

These measurements demonstrate that the conduction losses of MOSFETs can be reduced by an order of magnitude through cryo-cooling. The reduction of dissipation power permits the elimination of large heat sinks and provides the possibility to place the MOSFET chips closer together. As a result power circuits can be miniaturized. The switching losses of MOSFETs are lower than those of other devices since they are fast switching and do not exhibit the so-called "tail current". High-speed MR imaging requires switchmode gradient amplifiers with a relatively high power bandwidth (>20 kHz). Therefore, high PWM switching frequencies (>200 kHz) are needed which only MOSFETs can provide. IGBTs (Insulated Gate Bipolar Transistors) are too slow. This means that today the Cryo-MOSFET has no competitor for the application of MRI gradient amplifiers.

5. Design Philosophy for MRI Cryo-Gradient Amplifiers

The key technical objective of the design of Cryo-gradient amplifiers is the implementation of high-speed PWM switching (200–500 kHz). Gradient amplifiers should provide the following:

inductive coil current $I_L$ cannot change instantly, therefore the current flows now Higher gradient pulse currents for smaller field-of-view imaging (magnification);

Faster gradient rise times for increased imaging speed;

Dramatically reduced size, weight, and space requirements for the power system;

Higher energy efficiency, and therefore reduced air-conditioning load in the hospital, Considerably reduced cost of equipment and operation.

All these features can be implemented applying the concept of CPC.

Circuit Topologies: The Half- and Full-Bridge

Figure 5:
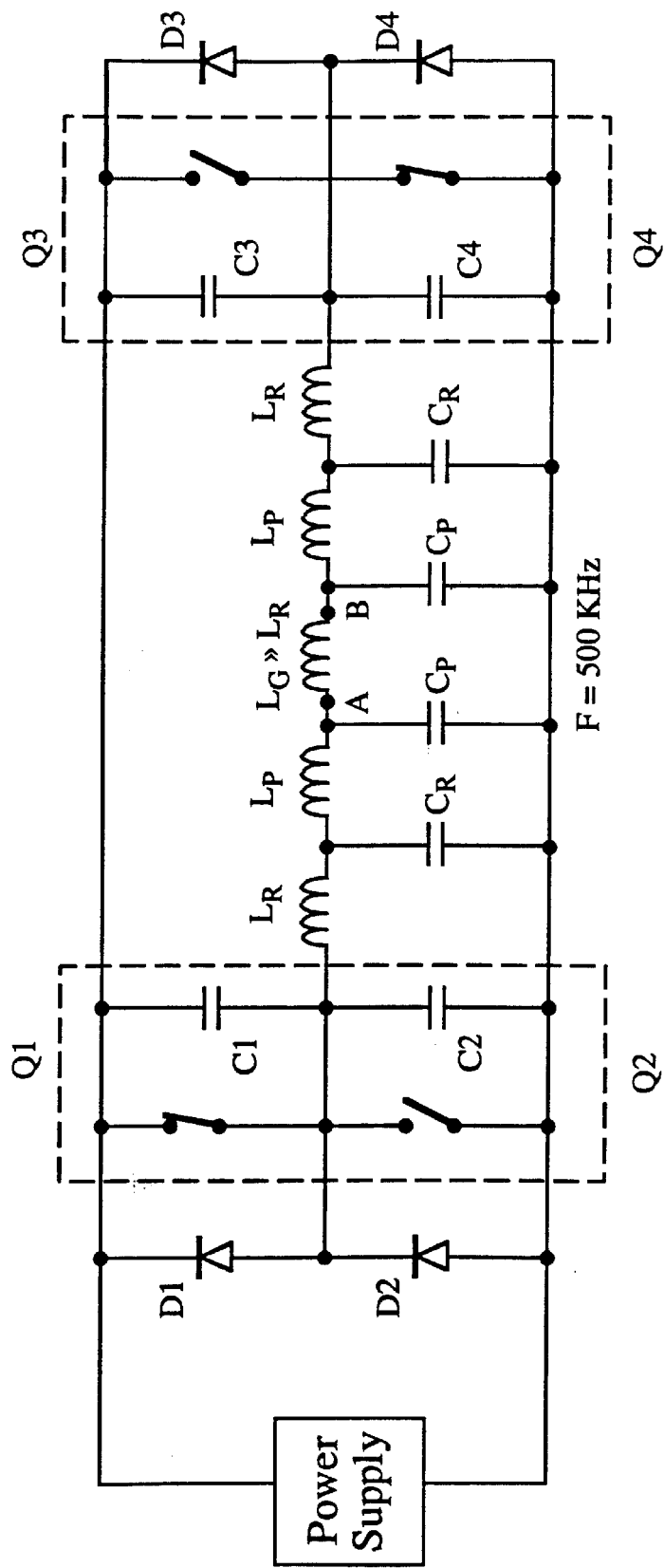

The key element of most high power electronics is the so-called half- or full-bridge (2 half-bridges) circuit shown in FIG. 5. For successful cryogenic power conversion one has to minimize all the losses in order to compensate for the cooling cost. The CPC concept for MRI is based on the assumption that even at higher frequencies the switching losses can be more or less eliminated by suitable soft-switching techniques to be found and implemented.

The following losses have to be considered:

The conduction losses which are reduced by a factor 10–15 at low currents and more at high currents by cryo-cooling and paralleling.

The voltage/current overlap losses to be reduced by fast- and soft-switching.

The losses due to MOSFET drain-source output capacity discharge during turn-on.

*The MOSFET source-drain diode reverse recovery losses eliminated or reduced by using the bi-directionality of the MOSFET (MOSFET commutation) or through the use of fast recovery diodes (FREDs).

The overlap and capacity discharge losses can be minimized in the half-bridge topology by a technique called zero-voltage-switching/clamped voltage (ZVS-CV), also known as quasi-resonant, pseudo-resonant or transition-resonant ZVS techniques. (Ref. [4] page 186–189). It is based on the assumption that the active devices can be switched fast compared to the voltage transition time. This condition can best be implemented with the fast-switching MOSFET. All other devices, IGBT, MCTs, GTO, etc. exhibit longer turn-off and turn-on times. In addition, the MOSFET has the required commutating diodes already built-in. Thus, at least at lower frequencies, no external diodes are required. The on-state source-drain diode losses can be reduced in the Cryo-MOSFET by turning it on (MOSFET commutation). This feature is due to the MOSFET bi-directionality (positive/negative current flow) not available in any other power device: A great advantage.

The ZVS-CV soft-switching technique can be explained as follows [4]. Let us assume the upper MOSFET Q1 (FIG. 5) is turned on carrying a filter coil current $I_L$. $Q_2$ is off. At time $t_1$ $Q_1$ is turned off fast compared to the total transition switching time, ideally in zero nanoseconds. Now, for a dead time $\Delta t(=t_2-t_1)$ both switches are off. The through the capacitors $C_1$ and $C_2$ charging $C_1$ and discharging $C_2$. At the same time the center pole voltage $V_p$ changes from $\sim V_B$ down to −0.7 V, turning on the lower diode $D_2$. It now carries the current until after the dead-time $\Delta t$ at time $t_2$ the lower switch $Q_2$ is turned on. The voltage transition is free of loss since no current flows through the MOSFETs or diodes: No overlap losses. With no load the filter capacity CR now acts as the voltage source and reverses the current direction. $I_L$ has a triangular shape at 50% duty cycle. Ideally, the dead time $\Delta t$ should be made equal to the capacitor discharge time $\Delta t_C$ which is given by:

$$\Delta t_c = \frac{(C_1 + C_2) \cdot V_s}{I_L}$$

At the turn-on of switch $Q_2$ the inductor current $I_L$ changes its direction and flows first through $D_2$ and then through $Q_2$. After half a cycle time the same soft-switching transition repeats itself at time $t_3$ for the current flowing through $Q_2$.

A problem occurs at large (or small) duty cycles if the current $I_L$ is large and does not change its polarity. In this case the ($C_1+C_2$) capacity charge and discharge mechanism does not work and soft-switching occurs only at one and not at both transitions of a full cycle. At the turn-off off of switch $Q_2$ the positive current transfers now from the switch to the commutating diode and the reverse recovery problems of that diode enter the picture. Unfortunately, the fast recovery diode MOSFETs (FREDFETs) do not work at 77 K due to some gate channel related "carrier freeze-out" effect [16]. But the reverse recovery charge/time of a normal MOSFET decreases with cryo-cooling, even if not as much as one would have hoped [16]. Paralleling fast FRED-diodes does not help since the on-state voltage of the cryo-MOSFET source-drain diode is lower than that of the fast recovery diodes. Using the MOSFET source-drain diode for the commutation function works fine at low frequencies (<10 kHz) if one slows down the switching speed of the transistor with large gate resistors (10–100 µl). This is necessary because the fast recovery of the diode produces dangerous dV/dt slopes which could retrigger the MOSFET to be turned off. In other words, while the MOSFET itself can handle fast voltage transients (20 V/ns–100 V/ns), its source-drain diode, if used, limits that permissible dV/dt value to much lower numbers: 2–5 V/ns. Since its reverse recovery time is relatively large (500–700 ns), and therefore the related reverse recovery loss high, the diode limits efficient high frequency switching.

Figure 6:
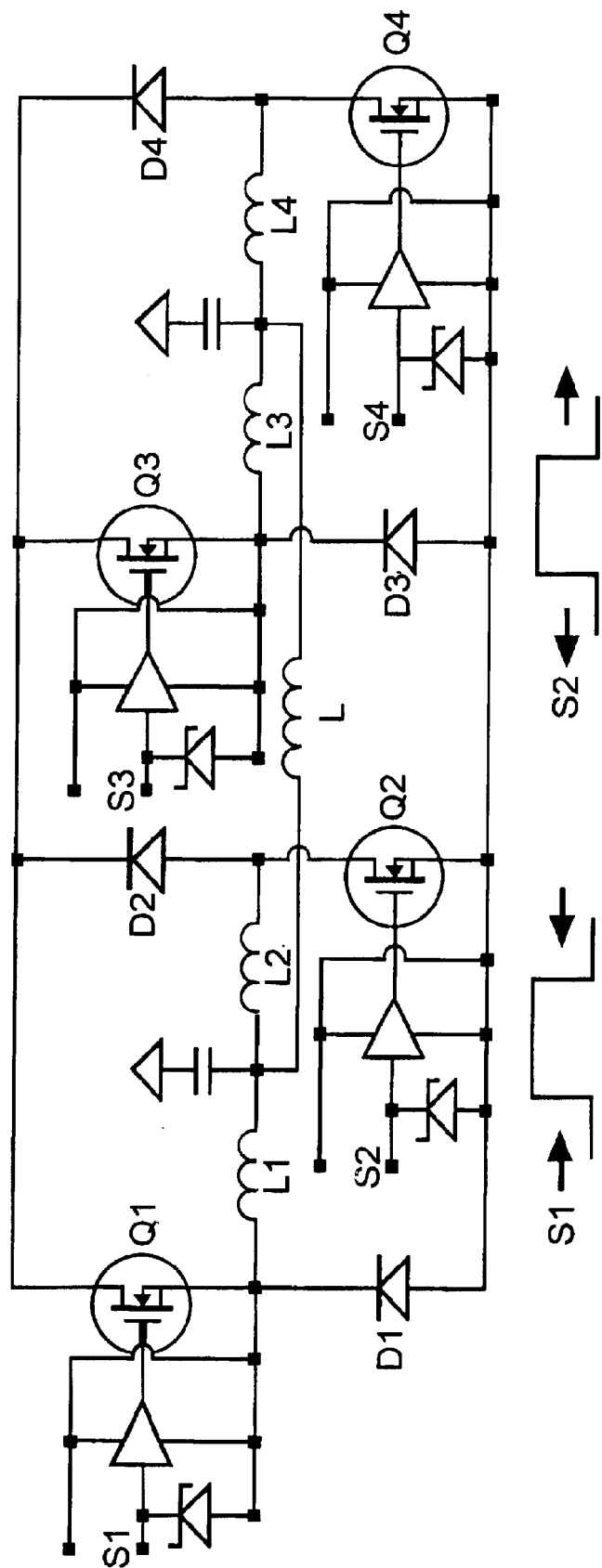

The OCIA or S-Topology (Stanley-Topology): A very elegant solution to the MOSFET/commutating diode dilemma has just recently (PESC-97) been proposed by Gerald Stanley and Ken Bradshaw from Techron, a division of Crown International, Inc. [8]. It separates the MOSFET switch and the diode commutation functions thus permitting the use of Cryo-MOSFETs as well as high-speed FRED-diodes together. This Stanley-topology or S-topology is shown in FIG. 6. "The interleaved four-quadrant PWM power stage results in a doubling of the output ripple frequency while greatly reducing the ripple current amplitude. Shoot-through currents are reduced to low di/dt events that are readily controlled allowing zero deadtime operation" [8]. Here the MOSFET does not work as commutator. A key feature is that the pulse width of control signal $S_1$ of an OC (opposed current) half-bridge is changed in the opposite direction to that of $S_2$. A cryo-germanium diode would be best for this topology.

Test Results:

Full-Bridge: A full-bridge circuit using 4×4 MOSFETs APT5010LVR (FB-1) has been tested. The dead time is 400 ns, the current capability at 77 K is 4×50 A=200 A. The 2-filter ferrite or air inductors were 18 µH each (stranded AWG10 wire). FIGS. 7 (a–c) show waveforms of pole voltage (half-bridge centerpoint) and quasi-resonant filter inductor current IL for 250, 400 and 500 kHz at a supply voltage of 350 V, 350 V and 250 V respectively measured with the power circuit immersed in LN2.

The triangular coil current was measured with a Pearson (415-494-6444) current monitor No. 2879 where 1 V=10 A. One can see that smooth switching waveforms were obtained up to 400–500 KHz with the drive circuitry developed. The main limitation is the increased power dissipation in the driver ICs (TC4422). The peak-to-peak coil currents were 25.2 A at 250 kHz, 15.6 A at. 400 kHz and 8.3 A at 500 kHz. At higher frequencies the coil current is decreased because of the reduced coil charging time. Then the current is no longer sufficient to provide a clean charge/discharge of the MOSFET output capacitors as required for ZVS-CV soft switching. The waveforms start to show distortions and ringing as seen in FIG. 7c. This is also illustrated by FIG. 7d where the waveforms for 400 kHz are compared for 350 and 120 V. Again, at the low voltage the current (5.2 APP) is not sufficient for a clean soft-switching operation as at 350 V (20 APP). Note the transition from low to high dv/dt and the RF oscillations at 120 V.

Figure 7A:
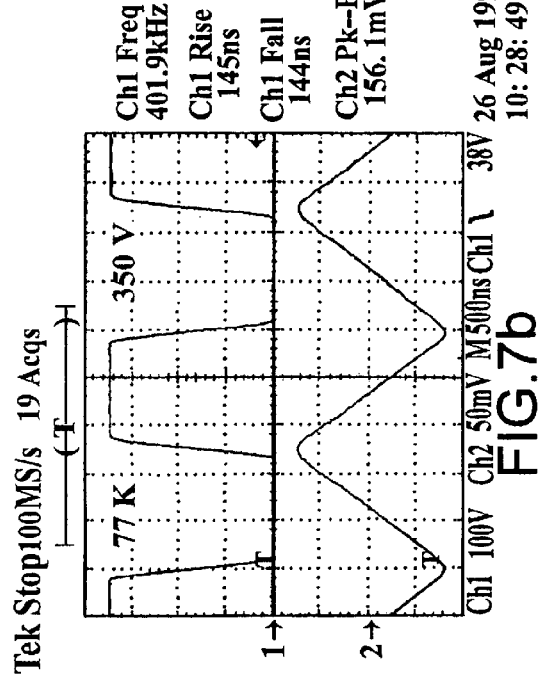
Figure 7B:
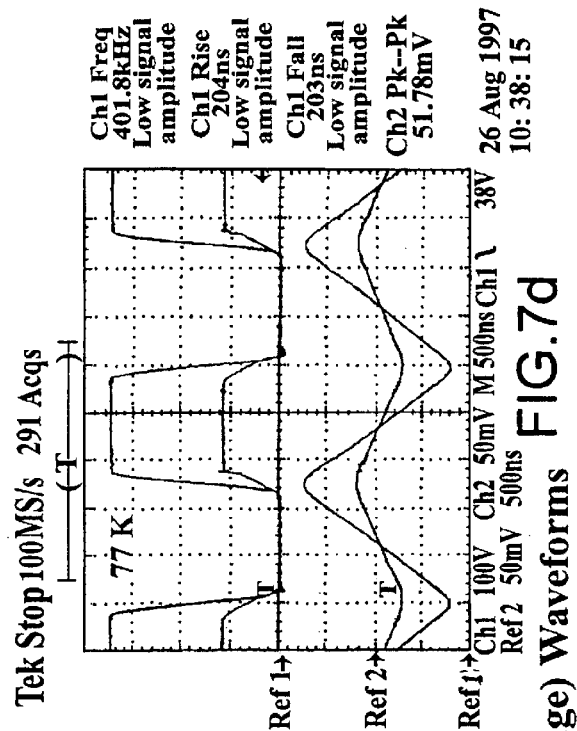
Figure 7C:
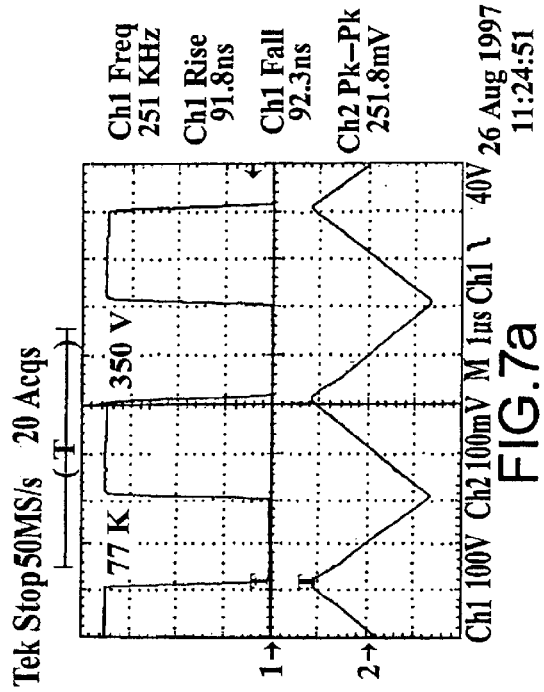
Figure 7D:
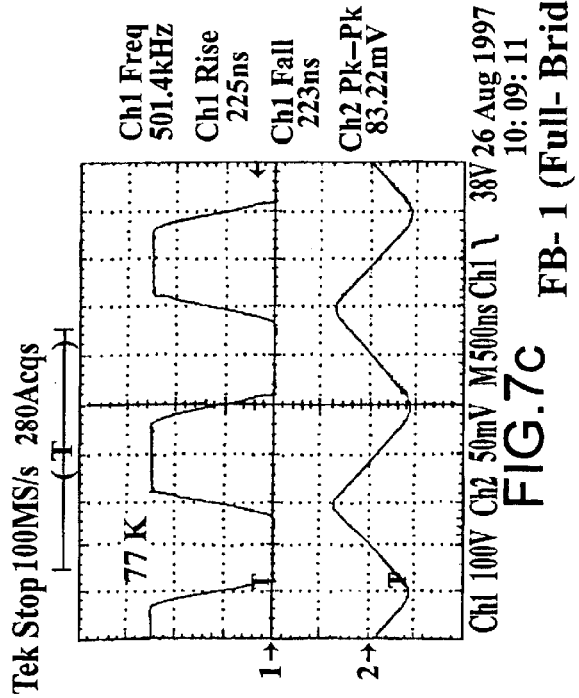

It is also interesting to see how the rise and fall times of the drain-source voltage transitions change with frequency from 92 ns at 250 kHz to 145 ns at 400 kHz and 224 ns at 500 kHz (FIGS. 7a–c). This increase is caused by the fact that the coil current decreases which means that a longer time is required for the discharge of the output capacitors. An MRI gradient coil was simulated with a 573 µH inductor having a DC resistance of 100 mΩ.

Test Results for the S-Topology at 77 K: The half-bridge S-topology (Stanley-topology of FIG. 6 with 4 paralleled APT5012LNR MOSFETs (500 V, 47 A, 0.12 Ω), 2 APT60D60B FRED-diodes (600 V, 60 A, <70 ns) and with 2 air coils of 18.6 µH each has been tested. The dead-time was 360 ns. As expected the MOSFET turn-off transition of the pole voltage is soft-switching and the FRED-diode turn-off transition is fast- and hard-switching. Clean 220 A current pulses at 310 V with a PWM switching frequency of 150 kHz have been generated at 77 K with this circuit into a 586 µH gradient coil or a 1.3Ω load resistor, respectively.

In summary, it has been shown that switchmode gradient amplifiers can be designed operating at high frequencies (100–600 kHz) and at cryogenic temperatures (77 K). A high-speed fiber-optic cryo-cooled MOSFET driver system was developed providing good (no-load) soft-switching performance of 4 MOSFET (4×50 A) switch assemblies operating at 77 K up to 600 kHz at a 350 V supply. The classical full-bridge circuit with 16 MOSFETs as well as the new OCIA- or S-Topology (16 MOSFETs and 8 FREDs) have been built and tested. Current pulses of more than 200 A were delivered into resistive (1.3Ω) and inductive (576 µH)

loads at 77 K. Since cryo-cooling speeds up diodes and MOSFETs very good RF (or even microwave) layout techniques must be employed for reliable cryo-power circuits. (This work was funded by the National Science Foundation under NSF-SBIR Contract No. DMI-9796142).

6. The MRI Cryo-RF Amplifier

Figure 8:
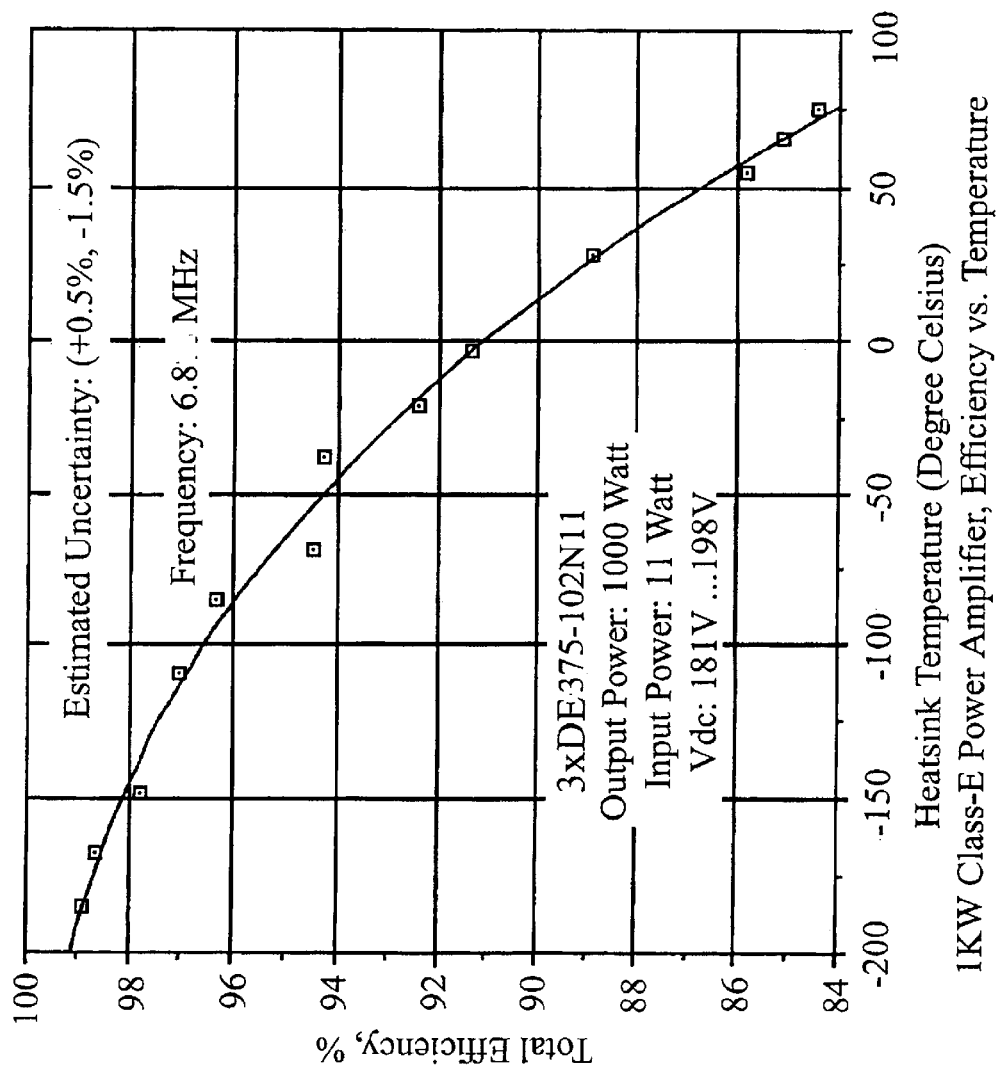
Figure 9:
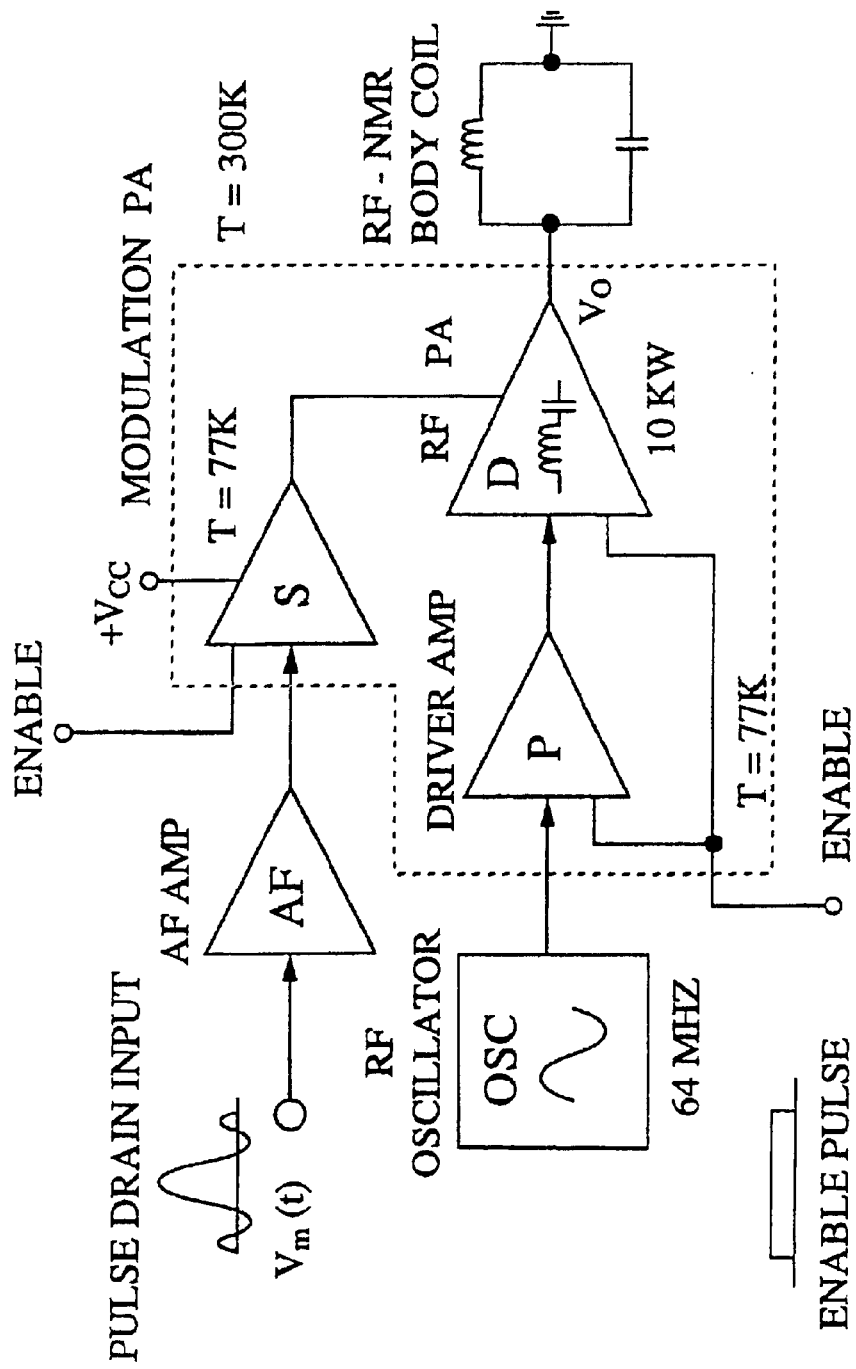

FIG. 8 shows the temperature dependence of the efficiency of a 6.8 MHz Class E RF amplifier at an output level of 1 kW. It demonstrates the usefulness of cryo-cooling for RF generation needed in MRI systems. Using such an RF amplifier one can design an RF transmitter as required for MRI employing drain voltage modulation. The Modulator amplifier can be a cryo-gradient amplifier. A block diagram is shown in FIG. 9.

7. The Cryo-Speed-Up Inverter.

Figure 10:
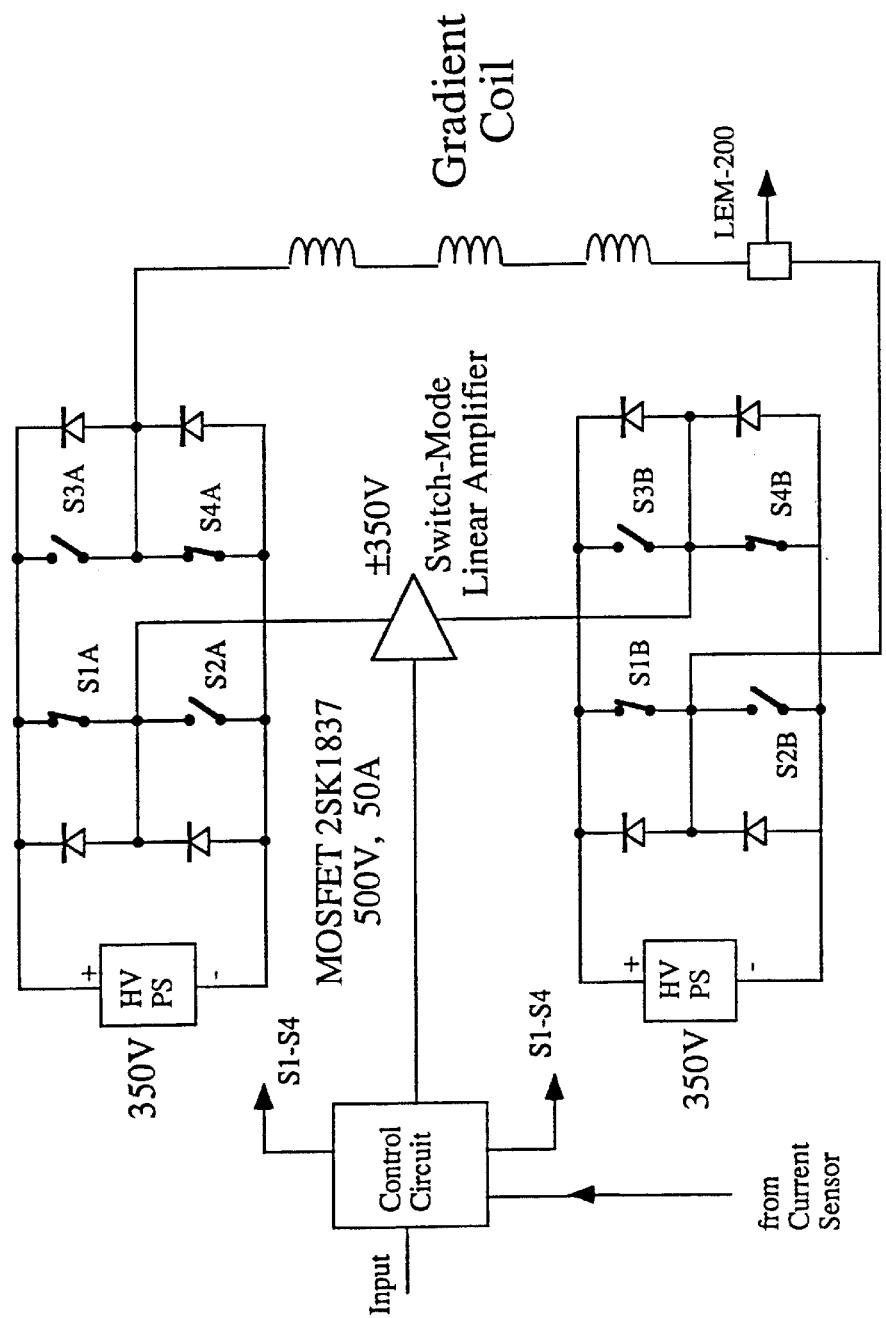

High-speed MR imaging of moving body parts such as the heart, the lungs, etc, require a higher voltage (1000–2000 V) gradient amplifier system. FIG. 10 shows the block diagram of a so-called Speed-Up Inverter used for this function. This circuit can, of course, also be implemented in the form of a cryo-circuit.

8. Brief Summary of the Invention

Figure 11:
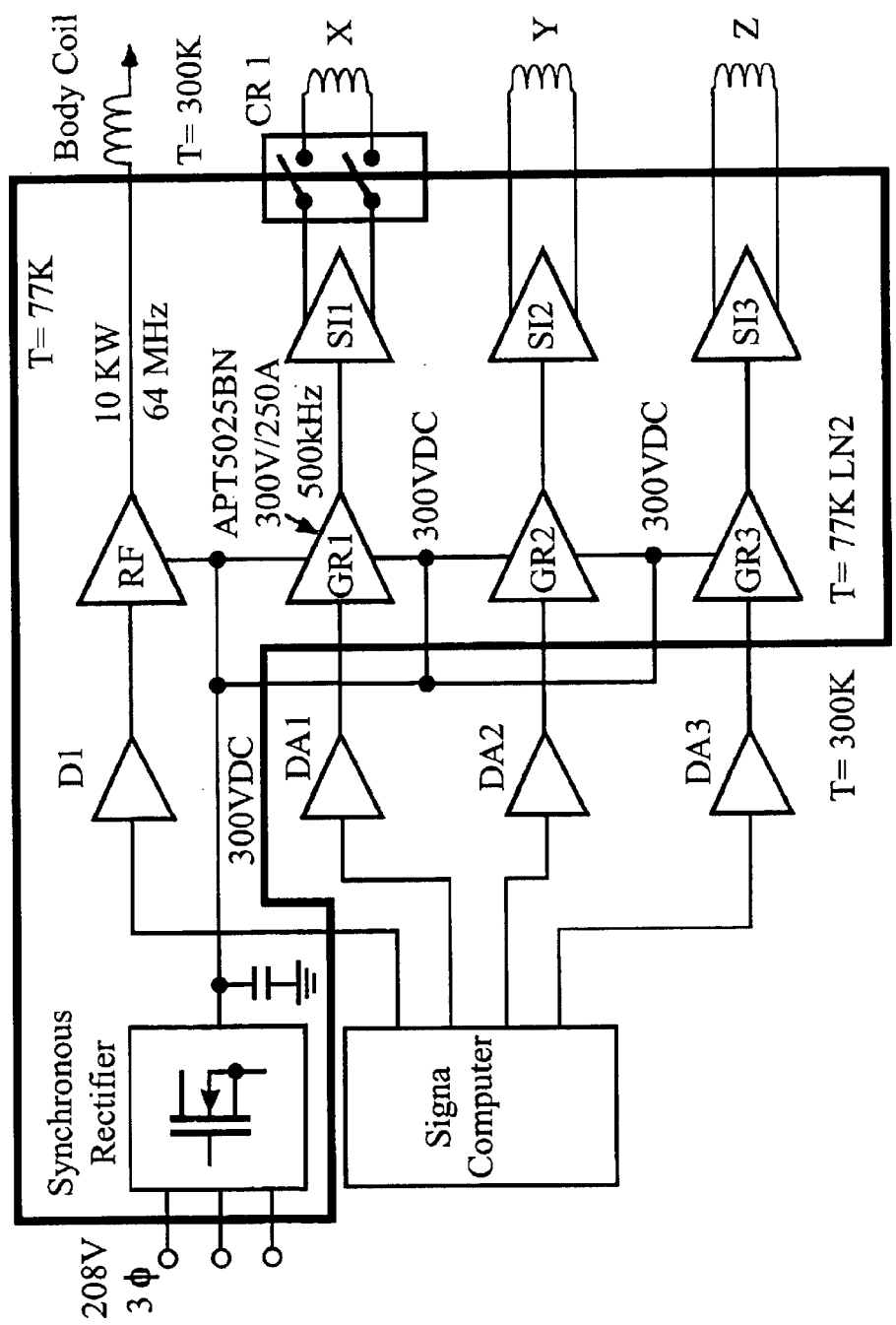

A brief (partial) summary of the invention is shown in FIGS. 3, 4 and 11. It demonstrates how RF amplifiers, gradient amplifiers and the speed-up inverters SI 1-S13 are all placed into a single cryo-dewar operating at 77 K or another suitable temperature between 77K and 200 K.

9. DESCRIPTION OF DRAWINGS

FIGS. 1 and 2: The documented measurements of the on-resistance of a 1000 V MOSFET demonstrate the physics behind the CPC concept: The drastic reduction of the loss producing on-state resistance by cryo-cooling due to the electron mobility increase at low temperatures.

FIGS. 4 and 11: A vision of the final Cryo-MRI system. The integration of the gradient and RF power subsystems into an LTS or HTS (High-Temperature Superconductor) whole-body imaging magnet. Not shown is the computer based on cryo-CMOS circuitry which could also be cryo-cooled.

FIG. 8: Shown is the measured efficiency of an RF 1000 W, 6.8 Mhz RF amplifier as a function of temperature.

FIG. 9: Block diagram of a cryogenic, high-efficiency NMR RF power amplifier using MOSFET drain modulation. As modulator one can use an MRI switch-mode cryo-gradient amplifier required anyway. Note that through integration, many leads do not go to the outside world, thus reducing thermal losses.

Figure 12:
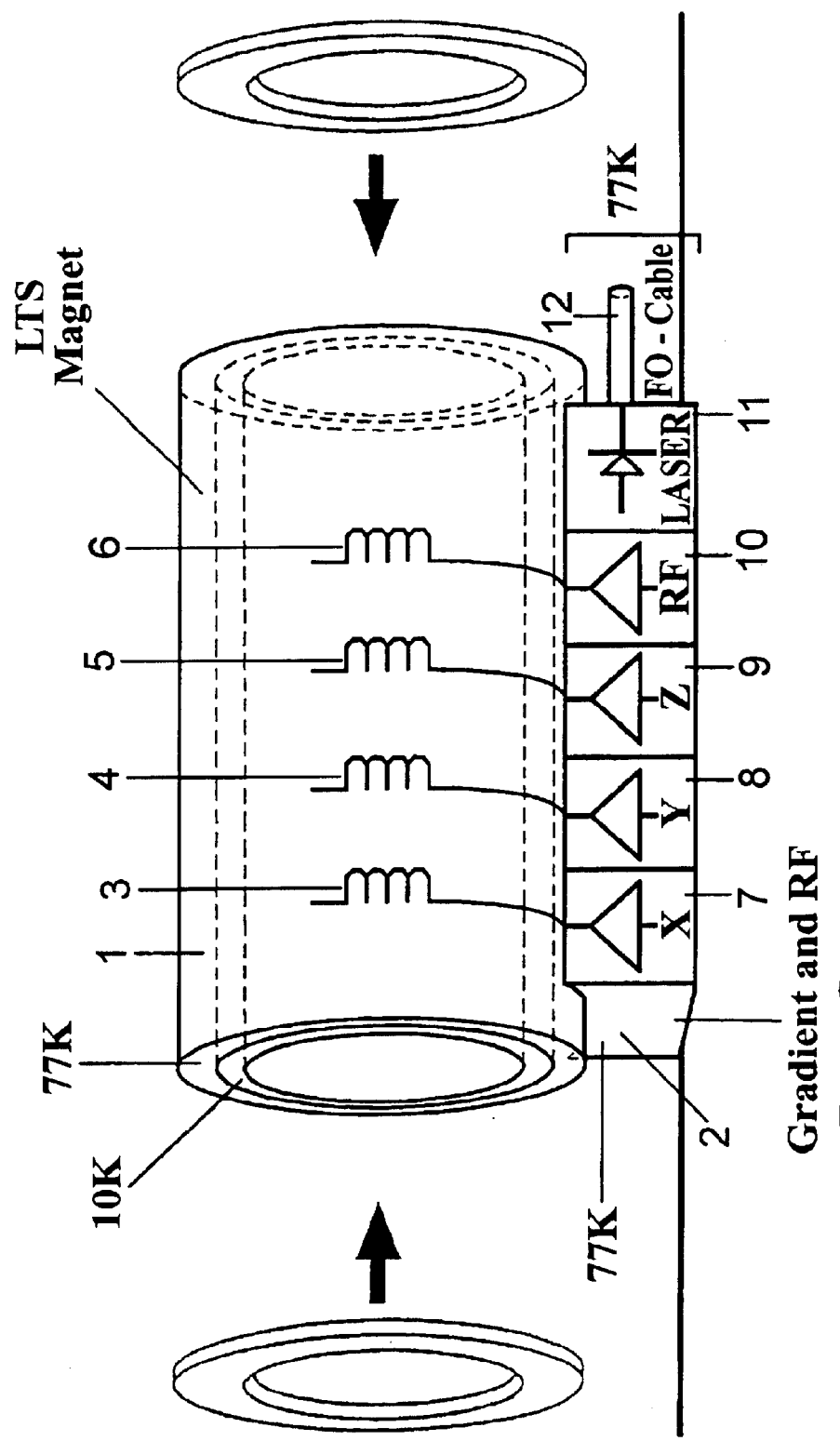

FIG. 12: The envisioned integration of the MRI power electronics 2 in the base of the magnet structure 1 is shown. The cryo-cooled x, y, z gradient amplifiers 7, 8 and 9 feed the gradient current pulses into the gradient coils 3, 4 and 5 which could also be cryocooled. The RF amplifier 10 delivers the required RF power to the body or head RF coil 6 (cooled or not). A cryo-cooled laser diode 11 provides light energy for laser surgery via a fiber-optic cable (FO) 12. The cooling of the laser diode results in a drastic increase of the laser power or a corresponding reduction in cost permitting smaller diodes.

The cryo-diode laser can also provide "diode pumping" for the generation of hyperpolarized inert gas imaging for the lungs and other body cavities. Gradient coils themselves could be made with HTS wires. Not shown are provisions for cryo-surgery equipment which can use the same cooling dewars.

Figure 13:
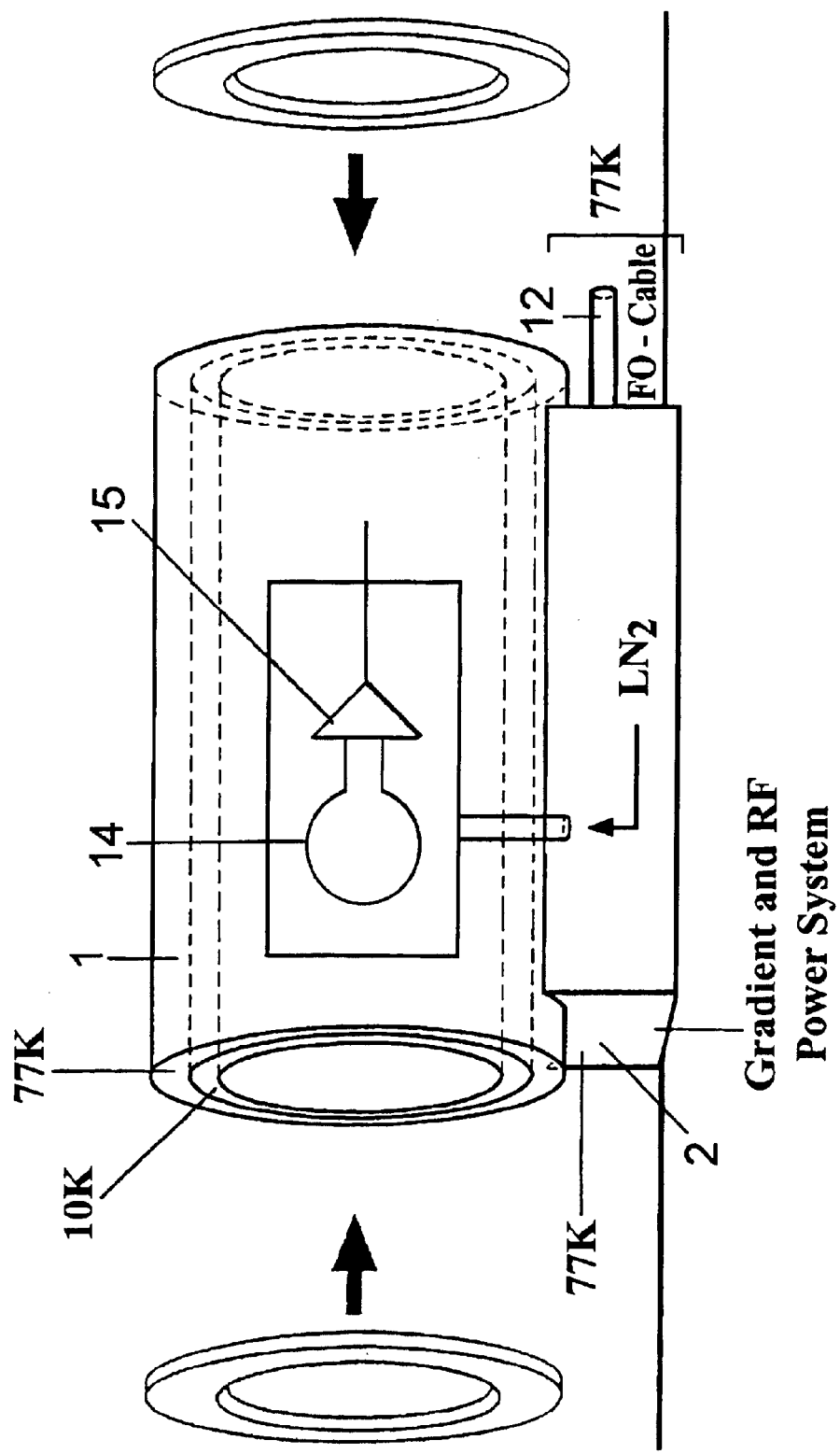

FIG. 13: This figure shows how the cooling system 2 for NMR RF receive (and maybe also the transmit) coils 14 made with high-temperature superconductors (HTS) will be integrated in the whole cryo-system. A cryo-preamplifier 15 provides better noise figures than uncooled ones.

Figure 14:
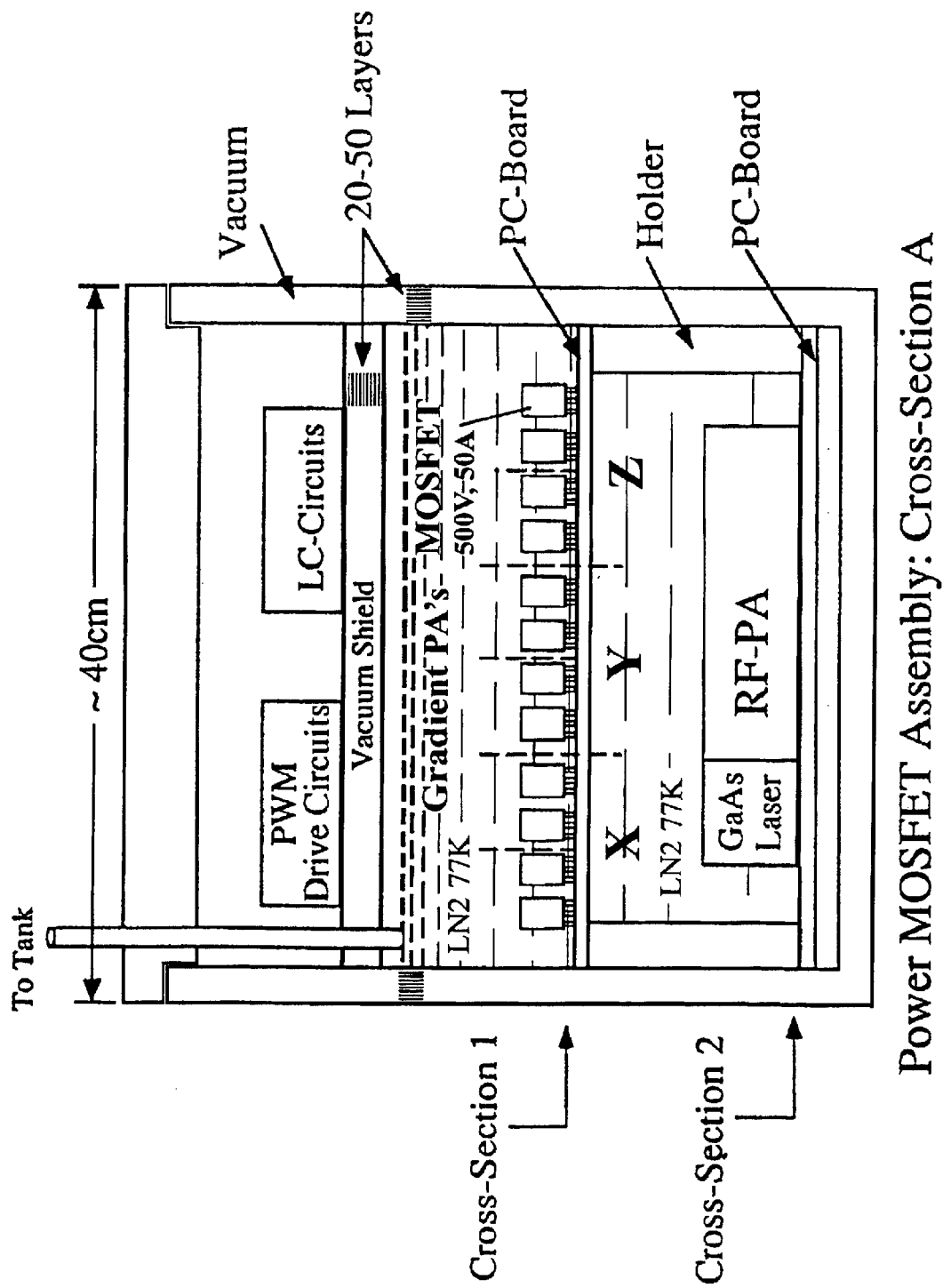
Figure 15:
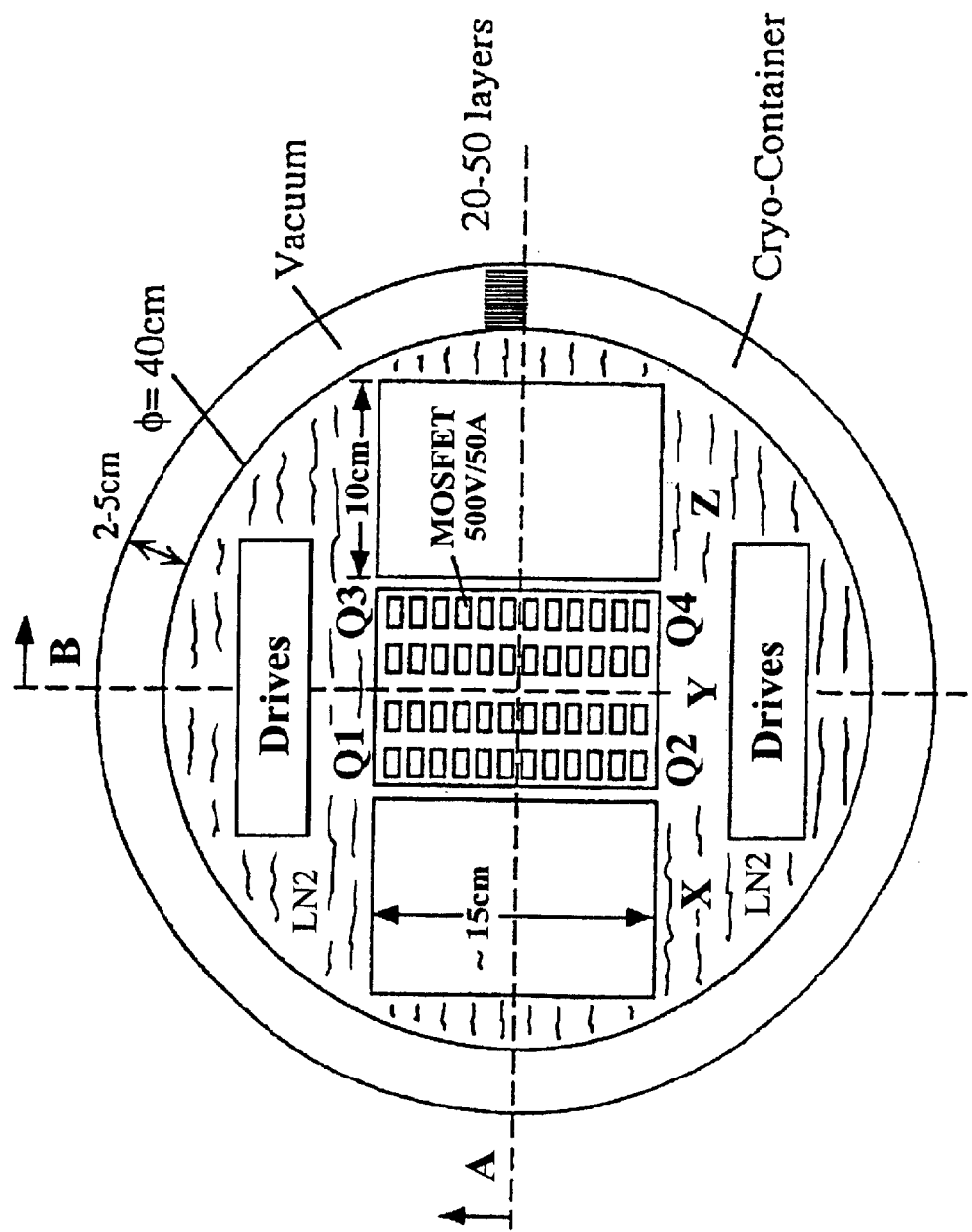

FIGS. 14 and 15: These Figures show dewar cross-sections and possible mounting arrangements for the cryo-power circuits assuming the use of discrete MOSFET devices. A further improvement would be the use of HDI (High Density Interconnect) cryo-multichip modules (CMCM). (See separate patent application, June 2000: "Active and Passive Components for Efficient Power Conversion").

Figure 16:
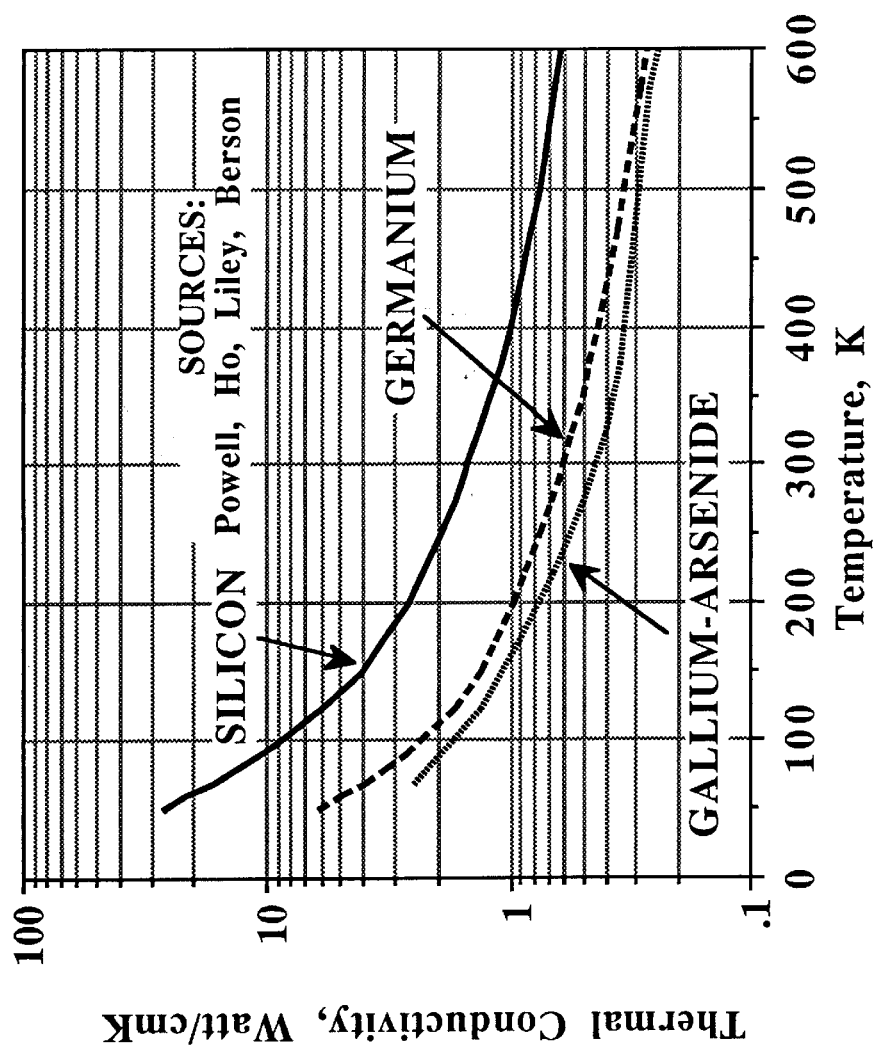
Figure 17:
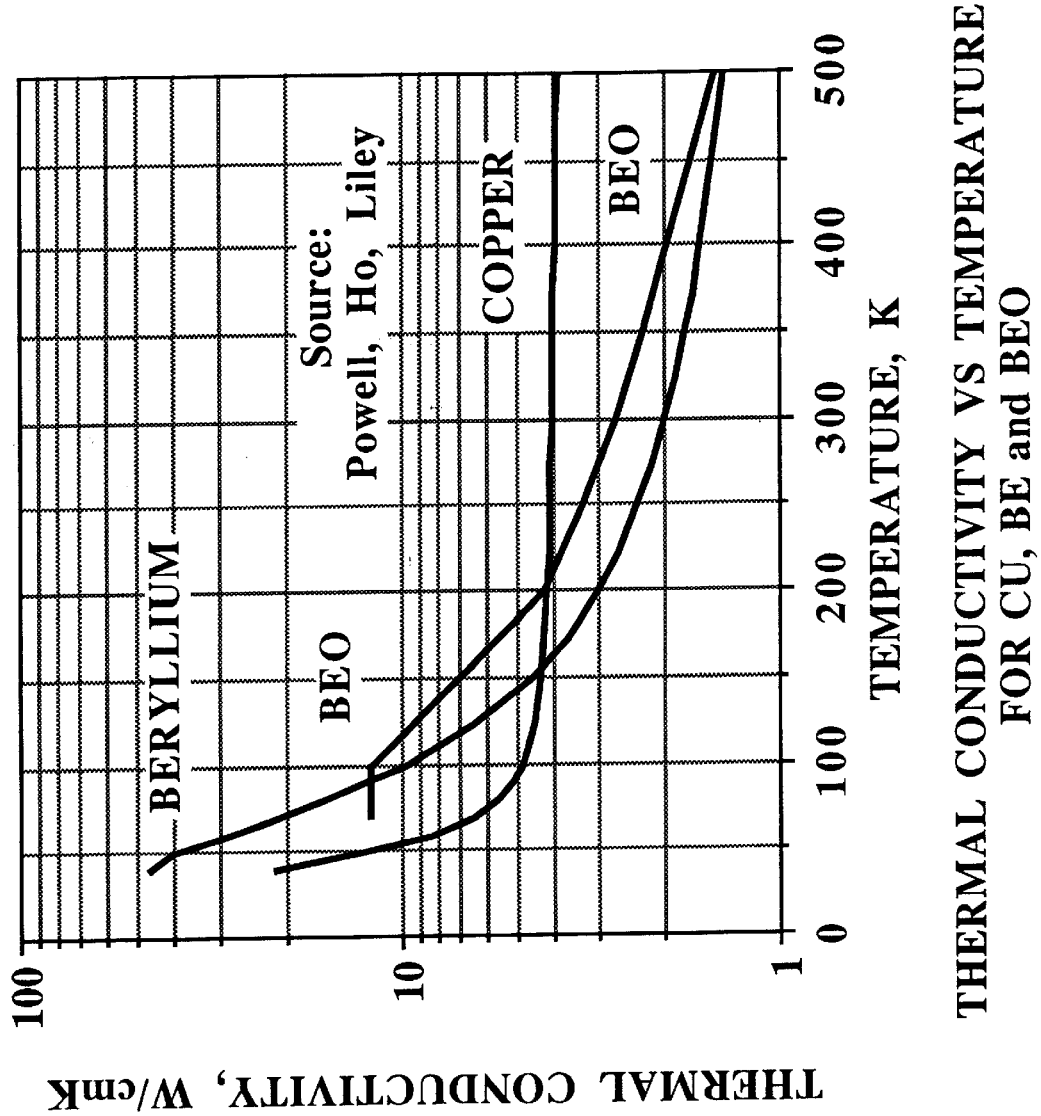

FIGS. 16 and 17: These figures teach that the thermal conductivity of silicon, etc, as well as various substrates such as beryllium oxide, etc. increase by an order of magnitude by cryo-cooling, an extremely important feature of the CPC concept.

Figure 18:
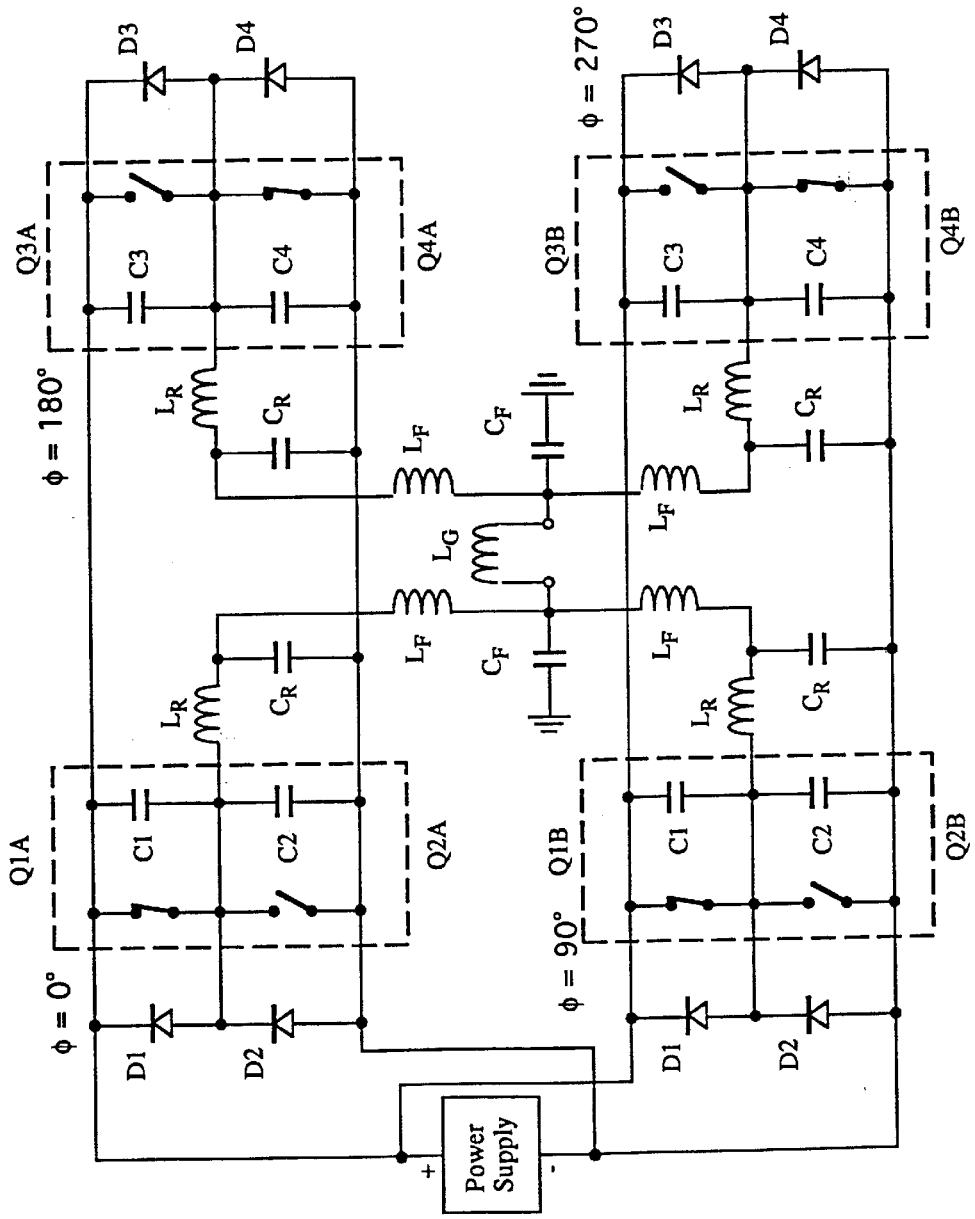

FIG. 18: Cryo-gradient amplifier topology for ripple reduction and improved soft-switching is shown.

Figure 19:
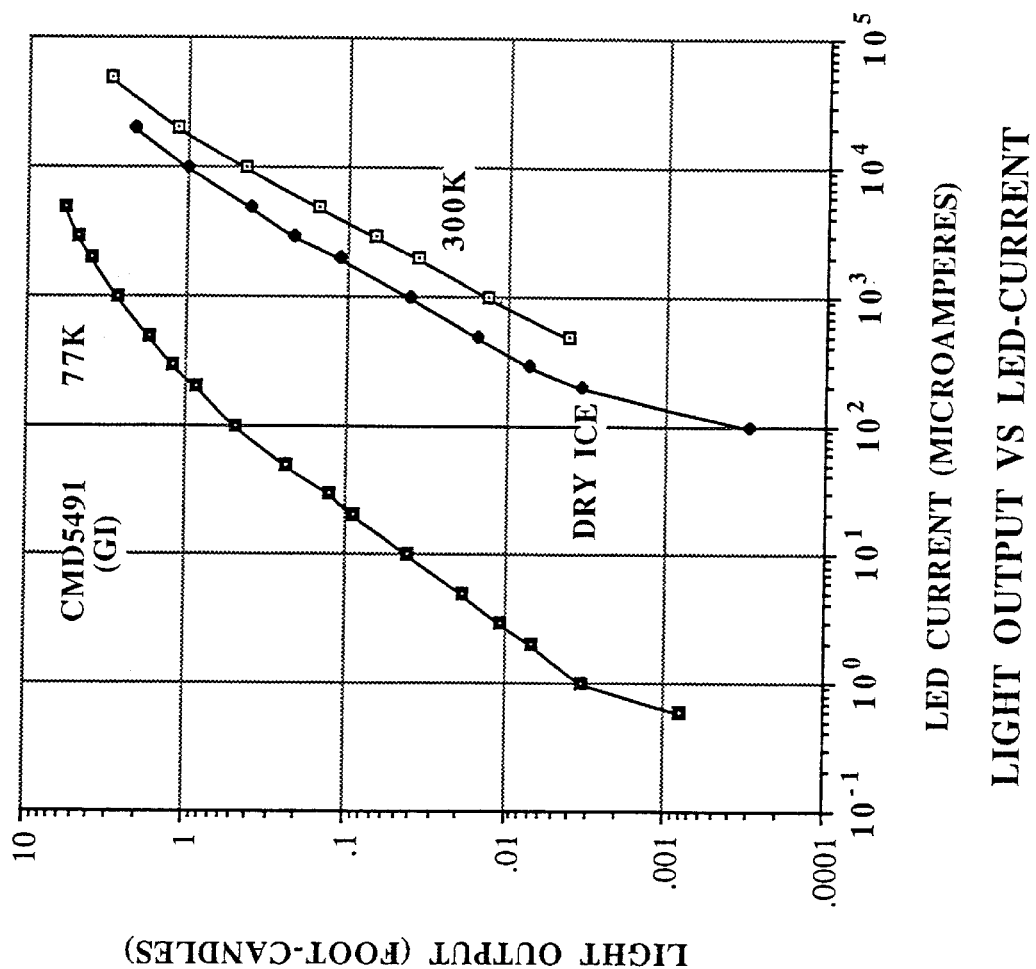

FIG. 19: Measured light output of cryogenically cooled LED demonstrating a drastic increase in emission efficiency. The same is true for laser cryo-diodes. Therefore, their cooling system can be integrated with the cryo-MRI machine for additional cost reduction.

10. Another Invention: Power Electronics for Whole-Body Prepolarized MRI

LTE proposes to apply the new concept of Cryogenic Power Conversion (CPC) [M1–M18] to the development of the high-power electronics (100 kVA to 1000 kVA) required for a pulsed whole-body magnet used in prepolarized [44–47] magnetic resonance imaging (PMRI). Thus the magnet can be resistive, or may have cryo-cooled copper or aluminum windings (cryo-resistive) or (high-temperature) superconducting coils.

It is anticipated that the Cryo-PMRI system will generate high pulse power levels for less dollars at higher efficiency, longer lifetimes, improved reliability, and at overall reduced system costs.

The following preliminary specifications are considered:

Magnet inner bore: 70 cm
L(coil)/R(coil): 1.2 sec
Magnetic Field: 0.75 Tesla
Power Dissipation: 202 kW
Current: 450 A
Voltage: 450 V
R(coil): 1Ω or less For a larger bore (>70 cm) and higher fields (~1 T –2 T), much higher pulse power levels will be required.

One of the problems with conventional magnetic resonance proton imaging (MRI) systems used in hospitals is their relatively high cost. A good MRI system still sells for $1 million to $2 million and an MRI scan still costs as much as $500–$1200.

S. M. Conolly and G. C. Scott under the leadership of Professor A. Macovski (Stanford University) are pioneering [44–47] the concept of Prepolarized MRI using Pulsed Magnets. The goal is to provide a drastic cost reduction of an MRI system. The pulse power levels for small-bore magnets are reasonable, but reach the megawatt levels for whole-body magnets.

The new concept of cryogenic power conversion (CPC, [M1–M1 8]) is especially useful for pulsed systems involving high power levels (>10 kVA). Therefore, LTE believes that the power electronics for the pulsed magnet of a prepolarized MRI system presents an ideal application of the CPC concept. The anticipated results are higher efficiency, lower cost, smaller size, higher reliability and longer lifetime.

Here is a short explanation of the concept of prepolarized MRI: "Prepolarized MRI (PMRI) is a low-cost approach [44, 45] that uses a strong (~0.5 T), inhomogeneous pulsed field to polarize and a weak, (~40 mT) homogeneous pulsed field during readout." (S. Conolly, [46]). It is obvious that a key component of this PMRI system is a low-cost pulse power generator. The circuitry is similar to that of a cryo-gradient amplifier or a chopper type circuit.

11. Cryo-Diodes for Laser Hyperpolarized He-3 and Xe-129 Gas Generation used in MR Imaging of Airway Diseases One problem of MRI is that the airways in the human being cannot be seen very well because air does not send out a NMR signal. A solution to this problem has been found: It is called Hyperpolarized Inert Gas Imaging (IGI) [48–52]. In order to produce his hyperpolarized gas He-3 or Xe-129 gas is illuminated with laser light of 796 nm wavelength. High diode laser power in the order of magnitude of 100 Watt is required. Therefore, a cryo-diode laser can be used, where the diode is also cooled and made more efficient together with the other cryo-power electronics discussed so far. (FIG. 12).

Relevant Patents of the Inventor

P1. O. Mueller and W. A. Edelstein, "Cryogenically Cooled Radio-Frequency Power Amplifier," U.S. Pat. No. 5,010,304, Apr. 23, 1991

P2 O. Mueller and L. S. Smith, "Cryogenic Semiconductor Power Devices," U.S. Pat. No. 5,126,830, Jun. 30, 1992

P3 J. C. Borowiec, O. M. Mueller, and S. A. El-Hamamsy, "Low-Inductance Package for Multiple Paralleled Devices Operating at High Frequencies," U.S. Pat. No. 5,170,337, Dec. 8, 1992

P4 C. Gold, O. Mueller, and E. Schempp, "Control Circuit for Cryogenically-Cooled Power Electronics Employed in Power Conversion Systems," U.S. Pat. No. 5,625,548, Apr. 29, 1997

P5 W. Wirth, T. McFarland, R. Vavrek, P. Roemer, O. Mueller, and J. Park, "Split gradient amplifier for an MRI system," U.S. Pat. No. 5,270,657, Dec. 14, 1993.

P6 R. Fillion, O. Mueller, J. Burgess, "Wireless RF Power Semiconductor Devices using High-Density Interconnect." U.S. Pat. No. 5,637,922, Jun. 10, 1997.

P7 O. Mueller, C. Yakymshyn, P. Roemer, R. Watkins: "Preamplifier Circuit for Magnetic Resonance Imaging Systems". U.S. Pat. No. 5,545,999, Aug. 13, 1996.

P8 E. Laskaris, B. Dorri, M. Vermilya, and O. Mueller, "Refrigerated Superconducting MR Magnet with Integrated Cryogenic Gradient Coils," U.S. Pat. No. 5,278,502, Jan. 11, 1994.

P9 J. Park, O. Mueller, and P. Roemer, "Gradient Current Speed-Up Circuit for High-Speed NMR Imaging System," U.S. Pat. No. 4,961,054, Oct. 2, 1990.

P10 O. Mueller, P. Roemer, and W. Edelstein, "Gradient Current Speed-Up Circuit for High-Speed NMR Imaging System," U.S. Pat. No. 5,017,871, May 21, 19911.

P11 O. Mueller, R. Gran, "Reducing Switching Losses in Series Connected Bridge Inverters and Amplifiers," U.S. Pat. No. 5,734,565, Mar. 31, 1998.

P12 C. Gold, O. Mueller, and E. Schempp, "Control Circuit for Cryogenically-Cooled Power Electronics Employed in Power Conversion Systems," U.S. Pat. No. 5,726,873, Mar. 10, 1998.

Relevant Publications on CPC by the Inventor

M1 O. Mueller, "RF Components at Low Temperatures," *Proceedings of RF EXPO EAST*, Philadelphia, Oct. 25–27, 1988, and RF-Design, January 1989.

M2 O. Mueller, "Cryogenic MOSFET power conversion—Is it feasible?" *Proceedings of the GE-GOSAM Hybrid & Packaging and ADC Electronics Panel Meeting*, Sagamore Resort and Conference Center, Bolton Landing, N.Y., Apr. 11–13, 1989

M3 O. Mueller, "Cryogenic MOSFET power conversion," *Proceedings of the IEEE Workshop on Low Temperature Semiconductor Electronics*, pp. 94–98, University of Vermont, Aug. 7 & 8, 1989 (IEEE 89TH0252-7)

M4 O. Mueller, W. A. Edelstein, and P. B. Roemer, "The cryogenic NMR gradient amplifier," *Eighth Annual Meeting, Society of Magnetic Resonance in Medicine*, Book of Abstracts, Part 2, p. 970, Amsterdam, The Netherlands, Aug. 12–18, 1989

M5 O. Mueller, "On-resistance, thermal resistance, and reverse recovery time of power MOSFETs at 77 K," *Cryogenics*, vol. 29, pp. 1006–1014, October 1989, M6 O. Mueller, "RF Components at Low Temperatures," *RF DESIGN*, vol. 12, no. 1, pp. 29–39, January 1989

M7 O. Mueller, "The cryogenic power MOSFET," *Proceedings of the 20th International Power Conversion Conference*, München, Germany, Jun. 25–29, 1990 (Also GE CRD Report 90CRD206)

M8 O. Mueller, "Switching losses of the cryogenic MOSFET and SIT," *Cryogenics*, vol. 30, pp. 1094–1100, December 1990 (Also an oral paper at the *International Conference on Low Temperature Electronics*, Berkeley, Calif., Apr. 23–26, 1990)

M9 O. Mueller and W. A. Edelstein, "The cryogenic NMR RF power amplifier," *Society of Magnetic Resonance in Medicine (SMRM)*, 9th Annual Meeting, New York, N.Y., Book of Abstract, p. 205, Aug. 18–24, 1990

M10 O. Mueller, "Cryogenic power conversion: Combining superconductors and semiconducting devices," *Fifth Annual Conference on Superconductivity and Applications, NYSIS*, Buffalo, N.Y., September 1991.

M11 O. Mueller, "Cryogenic power conversion: Combining superconductors and semiconducting devices," *American Institute of Physics*, "Superconductivity and its Applications," vol. 251, pp. 746–760, March 1992

M12 O. Mueller, K. Park, W. A. Edelstein (CRD), C. Park, S. S. Bayya, and R. L. Sider (Alfred University), "A cryogenic RF power amplifier (soon) using (HT) superconducting resonance inductors," *NYSIS Sixth Annual Conference on Superconductivity and Applications*, Buffalo, N.Y., Sep. 15–17, 1992: *AIP Conference Proceedings*, no. 273: "Superconductivity and its Applications," pp. 492–502 (Editors: H. S. Kwok et al.)

M13 O. Mueller and K. Herd, "Ultra-high efficiency power conversion using cryogenic MOSFETs and HT-superconductors," *IEEE PESC*-93, pp. 772–778, 1993

M14 R. D. Black, T. A. Early, P. B. Roemer, O. M. Mueller, et al.,"A high-temperature superconducting receiver for Nuclear Magnetic Resonance Microscopy," *Science*, vol. 259, pp. 793–795, Feb. 5, 1993

M15 O. Mueller and J. N. Park, "Quasi-linear IGBT inverter topologies," *IEEE APEC* 94, vol. 1, pp. 253–259, February 1994

M16 R. D. Black, P. B. Roemer, and 0. Mueller, "Electronics for a high-temperature superconducting receiver system for Magnetic Resonance Microimaging," *IEEE Transactions on Biomedical Engineering*, vol. 41, no. 2, pp. 195–197, February 1994

M17 O. Mueller, "Cryo-MOSFET and IGBT: A comparison," *Second European Workshop on Low Temperature Electronics (WOLTE*-2), *Journal de Physique*, colloque 3, vol. 6, pp. C3.219–C3.224, Belgium, June 1996

M18 O. Mueller, "Properties of high-power cryo-MOSFETs," *Conference Record of the 1996 Annual IEEE Industrial Applications Society Meeting (IAS-96)*, vol. 3, pp. 1443–1448 (IEEE 96CH35977), San Diego, Calif., October 1996

M19 W. Edelstein, I. Iben, O. Mueller, E. Uzgiris, H. Philipp, and P. Roemer, *In Environ. Prog.* 1994, vol. 4, p.13

M20 J. Hudgins, C. Godbold, W. Portnoy, and O. Mueller, "Temperature Effects on GTO Characteristics," *IEEE IAS-94 Conference Record*, pp. 1182–1186, 1994

M21 E. K. Mueller, O. M. Mueller: "High-speed Cryo-CMOS driver circuits for power inverters", Conference Paper CEC-1, CEC-ICMC-99, Montreal, Jul. 12–16, 1999

M22 O. M. Mueller, E. K. Mueller: "Cryogenic power inverters for MRI". Conference Paper CEC-2, CEC-ICMC-99., Jul. 12–16, 1999, Montreal, Canada M23 O. M. Mueller, E. K. Mueller: "A cryogenic power/energy distribution system". Conference Paper CPC-1, CEC-ICMC-99, Montreal, R. References 1. R. Singh, B. J. Baliga: Cryogenic Operation of Silicon Power Devices, Kluwer, Boston,
2. T. E. Bell: Innovations: "GaAs versus Gas Lasers for Surgery." *IEEE Spectrum*, February 1997, p. 16.
3. B. J. Baliga, et. al.: "SiC Discrete Power Devices." *NTIS*, January 1997, ADA319706
4. N. Mohan, T. Undeland, and W. Robbins, *Power Electronics: Converters, Applications, and Design*, John Wiley & Sons, Chapter 7, pp. 154–203
5. D. Sable, F. Lee, and B. Cho, "A Zero-Voltage-Switching Bidirectional Battery Charger/Discharger for the NASA EOS Satellite," *IEEE APEC-92*, pp. 614–621, February 1992
6. O. Mueller, W. A. Edelstein, and P. B. Roemer, "The cryogenic NMR gradient amplifier," *8th Annual Meeting, Society of Magnetic Resonance in Medicine, Book of Abstracts*, Part 2, p. 970, Amsterdam, NL, Aug. 12–18, 1989
7. O. Mueller, "On-resistance, thermal resistance, and reverse recovery time of power MOSFETs at 77 K," *Cryogenics*, vol. 29, pp. 1006–1014, October 1989
8. G. Stanley and K. Bradshaw, "Precision DC-to-AC Power Conversion by Optimization of the Output Current Waveform-the Half-Bridge Revisited," *28th Annual IEEE Power Electronics Specialists Conference*, June 1997, pp. 993–999.
9. R. W. DeDoncker, J. P. Lyons: "The Auxiliary Commutated Pole Converter", *IEEE-IAS Conf. Record*, 1990, pp. 1228–1235. and: "The Auxiliary Quasi-Resonant DC Link Inverter", PESC-91, pp. 248–253.
10. J. L. Hudgins, S. Menhart, W. M. Portnoy, V. A. Sankaran: "Temperature variation effects on the switching characteristics of MOS-gate devices." *EPE Firenze*, 1991, pp. O-261/O-266.
11. K. B. Hong, "Power MOSFET modeling for operation at liquid nitrogen temperature," Dissertation, Auburn University, Auburn, Ala., Dec. 16, 1992
12. O. Mueller and K. Herd, "Ultra-High Efficiency Power Conversion Using Cryogenic MOSFETs and HT Superconductors," *IEEE PESC* 93, pp. 772–778, 1993
13. R. D. Black, T. A. Early, P. B. Roemer, O. M. Mueller, et al.,"A high-temperature superconducting receiver for Nuclear Magnetic Resonance Microscopy," *Science*, vol. 259, pp. 793–795, Feb. 5, 1993
14. O. Mueller and J. Park, "Quasi-Linear IGBT Inverter Topologies," *IEEE APEC* 94, pp. 253–259, 2/94
15. W. Jackson, O. Mazzoni, and E. Schempp, "Characteristics of Semiconductor Devices at Cryogenic Temperatures," *IECEC*, Vol. 2, pp. 676–681, 1996
16. O. Mueller, "Properties of High-Power Cryo-MOSFETs, "*Conference Record of the 1996 Annual IEEE Industrial Applications Society Meeting (AIS-96)*, vol. 3, pp. 1443–1448 (IEEE 96CH35977), San Diego, Calif., October 1996
17. E. Schempp and W. Jackson, "Capacitive energy storage with hypercapacitors and cryogenic power electronics," *Power Systems World*, vol. 9, pp. 381–395, 1996
18. A. I. Gardiner, S. A. Johnson, and E. Schempp, "Operation of power electronic converters at cryogenic temperatures for utility energy conditioning applications," *IECEC*, vol. 14, pp. 2209–2214, 1996
19. R. Severns: "Superconductivity and low-temperature power converters". *Powertechnics Magazine*, vol. 4, no. 4, April 1988, pp. 32–34.
20. D. A. Grant, J. Gowar: "Power MOSFETs"-Theory and Applications". Wiley, NY, 1989. Page 158.
21. O. Mueller and W. Edelstein, "Cryogenically Cooled Radio-Frequency Power Amplifier," U.S. Pat. No. 5,010, 304, Apr. 23, 1991
22. E. Laskaris, B. Dorri. M. Vermilya, and O. Mueller, "Refrigerated Superconducting MR Magnet with Integrated Cryogenic Gradient Coils," U.S. Pat. No. 5,278, 502, Jan. 11, 1994
23. O. Mueller and W. A. Edelstein, "The cryogenic NMR RF power amplifier," *Society of Magnetic Resonance in Medicine (SMRM)*, 9th Annual Meeting, New York, N.Y., Book of Abstract, p. 205, Aug. 18–24, 1990
24. R. D. Black, P. B. Roemer, and O. Mueller, "Electronics for a high-temperature superconducting receiver system for Magnetic Resonance Microimaging," *IEEE Trans. on Biomedical Engineering*, vol. 41, no. 2, pp. 195–197, February 1994
25. O. Mueller et al., "A new 'quasi-linear,' high-efficiency, non-resonant, high-power MRI gradient system," *Proceedings of the Society of Magnetic Resonance in Medicine*, Vol. 1, p. 312, August 1993.
26. A. Schlögl, et.al.: Properties of COOL-MOS between 420 K and 80 K—The ideal device for cryogenic applications, ISPSD-99, May 1999, Toronto.
27. E. K. Mueller, O. Mueller: Cryo-driver circuits for power inverters. CEC-ICMC-99.
28. Walker, D. Hazelton, M. T. Gardner, et.al.: "Performance of Coils Wound from Long Lengths of Surface Coated, Reacted, BSCCO-2212 Conductor." *IEEE Trans. on Applied Superconductivity*, Vol. 7, No. 2, June 1997, pp. 889–892.
29. G. Stanley, K. Bradshaw, "Precision DC-to-AC power conversion by optimization of the output current waveform-the Half-Bridge revisited," PESC-97, pp. 993–999, June 1997
30. R. Fillion, W. A. Hennessy, H. Cole, J. Park, and V. Vandor, "Development of a Plastic Encapsulated Power Multichip Technology for High Volume, Low Cost Commercial Electronics," ISHM '94 Proc., pp. 84–90
31. R. Fisher, R. Fillion, J. Burgess, W. Hennessy, "High-Frequency, Low Cost, Power Packaging Using Thin Film Power Overlay Technology," APEC-95
32. W. Daum, R. J. Saia, R. Fillion, G. Forman, "High-G Multichip. Modules for Defense Systems Using HDI," ISHM '94 Proceedings, pp. 232–236
33. R. D. King, K. B. Haeffner, L. Salasoo, R. A. Koegl: "Hybrid Electric Transit Bus", IEEE Spectrum, July 1995, pp. 26–31.

34. L. O'Connor: "Building natural gas locomotives-A liquefied natural gas-fueled locomotive built by Morrison Knudsen . . . " Mechanical Engineering, April 1994, pp. 82–84.
35. F. Fedler: "Wasserstoff ist auch beim Flugzeug Energiequelle der Zukunft" ("Even for the airplane, [liquid] hydrogen (T=20 K) is the energy source of the future"). Die Welt, Apr. 7, 1996.
36. W. Athas: "AC-1: A Low-Power Microprocessor". USC/Information Sciences Institute, (310-822-1511). March 1997.
37. R. C. Johnson: "Reversible logic saves power-Resonant charging of capacitors in CMOS chips". EE Times, Jun. 2, 1997, p. 37.
38. K. D. Timmerhaus, T. M. Flynn: "Cryogenic Process Engineering", Plenum Press, New York, pp. 387–392, FIG. 7.5.
39. S. Jacob, S. Kasthurirengan, R. Karunanithi: "Investigation into the thermal performance of multi-layer insulation (330-77 K)", Cryogenics, 1992, Vol. 32, No 12, pp. 1137–1146.
40. J. Gerold: "Electrical Insulation in Superconducting Power Systems". IEEE Electrical Insulation Magazine, May/June 1992, Vol. 8, No. 3, 14–20.
41. H. Suzuki, K. Ishihara, S. Akita: "Dielectric Insulation Characteristics of Liquid-Nitrogen-Impregnated Laminated Paper-Insulated Cable", IEEE Trans. on Power Delivery, Vol. 7, No. 4, October 1992.
42. Lydal-Manning, Green Island, N.Y. 12183, Tel. 518-273-6320, Data Sheets.
43. Metallized Products, Inc, Winchester, Mass. 01890, Tel. 617-729-8300, Data Sheets: NRC-2, Cryogenic Insulation Material.
44. Macovski, S. Conolly, MRM 30:221, 1993
45. S. Conolly, et al., Proc. SRM, p. 935, 1995.
46. S. Conolly, G. C. Scott, A. Macovski: "Minimum-Cost Solenoid Design for Prepolarized MRI". ISMRM-98, p. 255, 1998,
47. H. Xu, S. M. Conolly, G. Scott, A. Macovski: "Minimum Power Homogeneous Magnet Design for Prepolarized MRI., ISMRM-98, 1998.
48. W. J. Cummings, O. Häusser, W. Lorenzen, D. R. Swenson, B. Larson: "Optical pumping of Rb vapor using high-power GaAlAs diode laser arrays". Physical Review A, Vol. 51, No. 6, June 1995, 4842–4851.
49. R. D. Black, et al.: "In Vivo He-3 MR Images of Guinea Pigs Lungs." Radiology, Vol. 199, June 1996, pp. 867–870.
50. M. S. Albert, G. D. Cates, B. Driehuys, et al: "Biological magnetic resonance imaging using laser-polarized Xe-129". Nature, Vol. 370, 21 Jul. 1994, pp. 199–201.
51. M. S. Albert: "Airway Disease: Hyperpolarized Gas MRI", Conf. Proc., ISMRM-98, p. 413.
52. S. Rosen, et al.: "Production and Delivery of Polarized X-129 for In-Vivo MRS/MRI". Conf. Proc., ISMRM-98, p. 1911.
53. T. Dearmin: "High-Power Diode Lasers Make Strong Impression in Graphics and Medical Imaging Applications". Opto-Power Corporation website, 7/98.
54. J. MacFall, H. C. Charles, R. D. Black, et al.: "Human Lung Air Spaces: Potential for MR Imaging with Hyperpolarized He-3". Radiology, Vol. 200, No. 2, August 1996, 553–558.
55. G. A. Johnson, et al.: "Inert Gas Imaging". Center for In Vivo Microscopy, Duke University, NC, Website
56. T. E. Bell: Innovations: "GaAs versus Gas Lasers for Surgery." IEEE Spectrum, February 1997, p. 16.
57. O. Mueller, "Cryo-MOSFET and IGBT: A comparison", Second European Workshop on Low Temperature Electronics (WOLTE-2), Journal de Physique, colloque 3, vol. 6, pp. C3.219–C3.224, Leuven, Belgium, June 1996.
58. O. Mueller, "Properties of high-power cryo-MOSFETs," Conference Record of the 1996 Annual IEEE Industrial Applications Society Meeting (IAS-96), vol. 3, pp.1443–1448 (IEEE 96CH35977), San Diego Calif., October 1996.
59. O. Mueller, W. A. Edelstein, and P. B. Roemer, "The cryogenic NMR gradient amplifier," Eighth Annual Meeting, Society of Magnetic Resonance in Medicine, Book of Abstracts, Part 2, p. 970, Amsterdam, The Netherlands, Aug. 12–18, 1989
60. O. Mueller, "On-resistance, thermal resistance, and reverse recovery time of power MOSFETs at 77 K," Cryogenics, vol. 29, pp. 1006–1014, October 1989
61. O. Mueller, "Cryogenic MOSFET power conversion," Proceedings of the IEEE Workshop on Low Temperature Semiconductor Electronics, pp. 94–98, University of Vermont, Aug. 7 & 8, 1989 (IEEE 89TH0252-7)
62. R. W. Hardin: "Diode Lasers are at the Heart of Cardiac Monitoring System." Photonics Spectra, May 1997.
63. B. L. Daniel, K. Butts, W. F. Block: "Magnetic Resonance Imaging of Frozen Tissues-Temperature Dependent MR Signal Characteristic and Relevance for MR Monitoring of Cryosurgerys." ISMRM-98, p. 353.
64. J. Tacke, R. Speetzen, et al.: "MRI-guided cryotherapy of experimentally induced liver tumors with an artifact-free nitrogen supplied cryo-probe." ISMRM-98, 1998

What is claimed is:

1. A magnetic resonance imaging (MRI) system, comprising:
   a magnet assembly including a superconducting magnet;
   a plurality of sub-systems, at least a portion of at least one said sub-system having enhanced performance when operating at a temperature below ambient;
   at least one refrigerated chamber containing and maintaining said superconducting magnet and said portion of said at least one of a plurality of sub-systems at a cryogenic temperature below ambient for enhanced performance; and
   a refrigerating system/performance enhancer for maintaining at said cryogenic temperature said magnet and said at least one sub-system in said at least one refrigerated chamber,
   wherein said plurality of sub-systems includes magnet current control circuits, gradient power supplies, gradient amplifiers, RF power supply, RF power amplifiers, laser diode power supply, cryo-laser diodes, RF coils, and gradient coils.

2. A magnetic resonance imaging (MRI) system, as in claim 1, wherein said superconducting magnet and at least one of said gradient amplifiers and RF power amplifiers are together in a common refrigerated chamber.

3. A magnetic resonance imaging (MRI) system, as in claim 2, wherein a laser cryo-diode is in said common refrigerated chamber.

4. A magnetic resonance imaging (MRI) system, as in claim 3, wherein a fiber optic cabling system delivers laser light for surgery during imaging.

5. A magnetic resonance imaging (MRI) system as in claim 1, wherein said at least one sub-system includes at least one of power inversion, conversion, and rectifying-circuits including cryo-germanium diodes.

6. A magnetic resonance imaging (MRI) system, as in claim 1 wherein gradient amplifiers are a sub-system and include a cryo-cooled "Opposed Current Half-Bridge" separating a MOSFET switch function from a diode commutating function for inductive loads.

7. A magnetic resonance imaging (MRI) system, as in claim 1, wherein said magnet assembly has a magnetic field that is pulsed by a cryogenic-pulse amplifier/inverter.

8. A magnetic resonance imaging (MRI) system, comprising:
- a magnet assembly including a superconducting magnet;
- at least one sub-system of a plurality of sub-systems, at least a portion of said at least one sub-system having enhanced performance when operating at a temperature below ambient;
- at least one refrigerated chamber containing and maintaining said superconducting magnet and said portion of said at least one of a plurality of sub-systems at a cryogenic temperature below ambient for enhanced performance; and
- a refrigerating system/performance enhancer for maintaining at said cryogenic temperature said magnet and said at least one sub-system in said at least one refrigerated chamber,
- wherein gradient amplifiers are a sub-system and include CMOS high current cryo-cooled monolithic driver circuits operating in LN2 provided by said refrigerating system.

9. A magnetic resonance imaging (MRI) system, comprising:
- a magnet assembly;
- at least one sub-system of a plurality of sub-systems, at least a portion of said at least one sub-system having enhanced performance when operating at a temperature below ambient;
- at least one refrigerated chamber containing and maintaining said portion of said at least one of a plurality of sub-systems at said temperature below ambient for enhanced performance; and
- a refrigerating system/performance enhancer for maintaining at said below ambient temperature said at least one sub-system in said at least one refrigerated chamber,
- wherein one said sub-system includes a Cryo-Speed-Up Inverter for high speed imaging.

10. A magnetic resonance imaging (MRI) system, comprising:
- a magnet assembly;
- at least one sub-system of a plurality of sub-systems, at least a portion of said at least one sub-system having enhanced performance when operating at a temperature below ambient;
- at least one refrigerated chamber containing and maintaining said portion of said at least one of a plurality of sub-systems at said temperature below ambient for enhanced performance; and
- a refrigerating system/performance enhancer for maintaining at said below ambient temperature said at least one sub-system in said at least one refrigerated chamber,
- wherein one said subsystem includes a cryo-diode laser cooled cryogenically by said refrigerating system for hyper-polarized inert gas imaging.

11. A magnetic resonance imaging (MRI) system, comprising:
- a magnet assembly;
- a plurality of sub-systems, at least a portion of at least one said sub-system having enhanced performance when operating at a temperature below ambient;
- at least one refrigerated chamber containing and maintaining said portion of said at least one of a plurality of sub-systems at said temperature below ambient for enhanced performance; and
- a refrigerating system/performance enhancer for maintaining at said below ambient temperature said at least one sub-system in said at least one refrigerated chamber,
- wherein said plurality of sub-systems includes magnet current control circuits, gradient power supplies, gradient amplifiers, RF power supply, RF power amplifiers, laser diode power supply, cryo-laser diodes, RF coils and gradient coils.

12. A magnetic resonance imaging (MRI) system, as in claims 11, wherein said magnet assembly includes a superconducting magnet, said magnet and at least one of said gradient amplifiers and RF power amplifiers are together in a common refrigerated chamber.

13. A magnetic resonance imaging (MRI) system, as in claim 12, wherein a laser cryo-diode is in said common refrigerated chamber.

14. A magnetic resonance imaging (MRI) system, as in claim 12, wherein said at least one sub-system includes at least one of power inversion, conversion, and recycling circuits including cryo-germanium diodes.

15. A magnetic resonance imaging (MRI) system, as in claim 11, wherein gradient amplifiers are a sub-system and include a cryo-cooled "Opposed Current Half-Bridge" separating a MOSFET switch function from a diode commutating function for inductive loads.

16. A magnetic resonance imaging (MRI) system, comprising:
- a magnet assembly;
- at least one sub-system of a plurality of sub-systems, at least a portion of said at least one sub-system having enhanced performance when operating at a temperature below ambient;
- at least one refrigerated chamber containing and maintaining said portion of said at least one of a plurality of sub-systems at said temperature below ambient for enhanced performance; and
- a refrigerating system/performance enhancer for maintaining at said below ambient temperature said at least one sub-system in said at least one refrigerated chamber,
- wherein gradient amplifiers are a sub-system and include CMOS high current cryo-cooled monolithic driver circuits operating in LN2 provided by said refrigerating system.

17. A magnetic resonance imaging (MRI) system, comprising:
- a magnet assembly;
- at least one sub-system of a plurality of sub-systems, at least a portion of said at least one sub-system having enhanced performance when operating at a temperature below ambient;
- at least one refrigerated chamber containing and maintaining said portion of said at least one of a plurality of sub-systems at said temperature below ambient for enhanced performance; and
- a refrigerating system/performance enhancer for maintaining at said below ambient temperature said at least one sub-system in said at least one refrigerated chamber,
- wherein high current buss-work is constructed from high temperature superconducting materials operated at cryogenic temperature.

* * * * *